(12) United States Patent
Guan et al.

(10) Patent No.: US 12,299,332 B2
(45) Date of Patent: May 13, 2025

(54) MEMORY DEVICES, OPERATION METHOD THEREOF AND MEMORY SYSTEM

(71) Applicant: Yangtze Memory Technologies Co., Ltd., Hubei (CN)

(72) Inventors: Lei Guan, Hubei (CN); HongTao Liu, Hubei (CN); Yuanyuan Min, Hubei (CN); WenZhe Wei, Hubei (CN); Tingze Wang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 212 days.

(21) Appl. No.: 18/306,672

(22) Filed: Apr. 25, 2023

(65) Prior Publication Data
US 2024/0220168 A1 Jul. 4, 2024

Related U.S. Application Data

(60) Provisional application No. 63/477,968, filed on Dec. 30, 2022.

(30) Foreign Application Priority Data

Apr. 3, 2023 (CN) .......................... 202310372157.6

(51) Int. Cl.
*G11C 16/16* (2006.01)
*G06F 3/06* (2006.01)
*G11C 16/14* (2006.01)

(52) U.S. Cl.
CPC ............ *G06F 3/0679* (2013.01); *G11C 16/14* (2013.01); *G11C 16/16* (2013.01)

(58) Field of Classification Search
CPC ...................................................... G11C 16/16
USPC ................................................... 365/185.29
See application file for complete search history.

(56) References Cited

U.S. PATENT DOCUMENTS

2019/0066797 A1* 2/2019 Yip ........................ G11C 16/14

* cited by examiner

*Primary Examiner* — Jason Lappas
(74) *Attorney, Agent, or Firm* — Conley Rose, P.C.

(57) ABSTRACT

The present disclosure provides a method for erasing a memory device. The method includes applying a word-line voltage to a word line of the memory device, wherein a first set of memory cells coupled to the word line are each configured to store a first number of bits data. The method also includes applying a hold voltage to a selected dummy line for a first time period, wherein a second set of memory cells coupled to the selected dummy line are each configured to store a second number of bits data less than the first number of bits data. The method further includes removing the hold voltage from the selected dummy line after the first time period such that an electric potential of the selected dummy line rises to a first voltage higher than the word-line voltage; and increasing the first time period incrementally in each of subsequent erase loops.

20 Claims, 14 Drawing Sheets

MEMORY DEVICES, OPERATION METHOD THEREOF AND MEMORY SYSTEM

CROSS-REFERENCE TO RELATED APPLICATIONS AND INCORPORATION BY REFERENCE

This application claims priority to Chinese Patent Application No. 202310372157.6 filed on Apr. 3, 2023, which claims priority to U.S. Provisional Application No. 63/477,968 filed on Dec. 30, 2022, all of which are incorporated herein by reference in its entirety.

TECHNICAL FIELD

The present disclosure generally relates to the field of semiconductor technology, and more particularly, to methods for erasing a three-dimensional NAND memory.

BACKGROUND

In many servers and mobile devices, NAND memory device is widely used as the primary non-volatile storage device due to its high storage density and relatively low access latency. To increase storage capacity, in a state-of-art NAND memory device, each memory cell can store multiple bits. For example, in a quadruple-level-cell (QLC) mode, each memory cell can store 4 bits.

BRIEF SUMMARY

The embodiment of the application discloses a storage (memory) device, which comprises a bottom selection gate, a bottom selected dummy (first/second bottom dummy line), a word line (WL), a top selected dummy (first/second top dummy line) and a top selection layer (first/second top edge lines). Among them, the bottom selection gate, the bottom selected dummy, the word line (WL), the top selected dummy and the top selection layer are not limited to only one layer. The WL including a top edge storage layer and a bottom edge storage layer. For convenience of expression, the top selected dummy mentioned in this application is closed to the top edge storage layer, and the bottom selected dummy is closed to the bottom edge storage layer.

With the development of 5G and big data in modern society, the demand for storage capacity is increasing. As the current mainstream storage device, 3D NAND Flash has the advantages of fast reading and writing speed and large storage capacity. With higher and higher storage density, the number of stacked layers and the number of storage bits of a single storage unit also increase. A single memory cell stores four bits, which is called QLC (Quad-Level Cell). This application takes QLC as an example, but it is not limited to QLC, and can also be applied to MLC, PLC, TLC and other types of memory devices. To ensure the reliability requirement of edge word lines, in some embodiments, several edge word lines are set to non-QLC pattern, such as SLC. However, the capacity of the memory device will be lost. Therefore, some upper and lower selected dummy should be programmed into a certain pattern to compensate for the lost capacity. For example, the selected dummy adjacent to the word line (WL) should also be programmed with SLC.

In an embodiment of the present application, data is stored in the selected dummy, and when block erasing is performed, the selected dummy also needs to be erased, and then new data is written. In some cases, when the erase depth of the memory cell corresponding to the redundancy layer is as deep as the erase depth of the memory cell corresponding to the word line, the normal programming of the memory cell will be affected. The application proposes an embodiment to independently control the erase/erase verification voltage of the selected redundant layer. Option 1 is to give a fixed erasing compensation voltage to the selected redundant layer, and Option 2 is to use a fixed H&R voltage to make it shallower. The former needs an additional voltage regulator to realize, which increases the circuit design area; The erasing efficiency of the latter is not high.

Another embodiment of the present application proposes an erasing operation for the selected redundant layer by using a step-by-step hold & release voltage (first/second voltages). It can save the number of voltage sources, thus saving the circuit area, simplifying the circuit design, accurately controlling the erasing depth of the memory cells to be erased, and improving the erasing efficiency. Step-by-step hold & release voltage is provided to erase the memory cells corresponding to the selected redundant layer, and the erasing accuracy of the selected redundant layer can be improved by combining the corresponding erasing verification voltage. The erasing method of the embodiment of the present application is not only limited to erasing the memory cells corresponding to the selected redundancy layer, but also applicable to other erasing operations of the nonvolatile memory. The present disclosure provides methods for erasing a three-dimensional NAND memory.

One aspect of the present disclosure provides a method for erasing a memory device. The method comprises applying an erase voltage to a common source line and/or a bit line of the memory device; applying a word-line voltage to a word line of the memory device, wherein a first set of memory cells coupled to the word line are each configured to store a first number of bits data. The method also comprises applying a hold voltage to a selected dummy line of the memory device for a first time period, wherein a second set of memory cells coupled to the selected dummy line are each configured to store a second number of bits data, and the second number is less than the first number. The method further comprises removing the hold voltage from the selected dummy line after the first time period such that an electric potential of the selected dummy line rises to a first voltage, wherein the first voltage is higher than the word-line voltage. The method also comprises increasing the first time period incrementally in each of subsequent erase loops.

In some implementations, the first voltage decreases incrementally in each of the subsequent erase loops.

In some implementations, the method further includes increasing the erase voltage incrementally in each of the subsequent erase loops.

In some implementations, the method further includes increasing the erase voltage by an erase step voltage in each of the subsequent erase loop.

In some implementations, the method further includes applying a further hold voltage to an unselected dummy line for a second time period; and removing the further hold voltage from the unselected dummy line after the second time period such that a further electric potential of the unselected dummy line rises to a second voltage higher than the first voltage.

In some implementations, the method further includes applying the further hold voltage to a top select gate for the second time period; and removing the further hold voltage from the top select gate after the second time period such that a third electric potential of the top select gate rises to the second voltage.

In some implementations, the second time period is shorter than the first time period.

In some implementations, the further hold voltage and the hold voltage have same magnitudes.

In some implementations, the hold voltage and the word-line voltage have same magnitudes.

In some implementations, the method further includes performing a verify operation to determine whether the first set of memory cells and the second set of memory cells are at an erased state.

In some implementations, the method further includes proceeding to a subsequent erase loop when the first set of memory cells and/or the second set of memory cells fail the verification.

Another aspect of the present disclosure provides a memory device. The memory device includes an array of memory cells arranged in a plurality of rows; a plurality of word lines respectively coupled to the plurality of rows of the memory cells; and a peripheral circuit coupled to the plurality of word lines. The peripheral circuit is configured to apply an erase voltage to a common source line and/or bit lines of the memory device, and apply a word-line voltage to the plurality of word line, wherein a first set of memory cells coupled to the plurality of word lines are each configured to store a first number of bits data. The peripheral circuit is also configured to apply a hold voltage to a selected dummy line of the memory device for a first time period, wherein a second set of memory cells coupled to the selected dummy line are each configured to store a second number of bits data, and the second number is less than the first number. The peripheral circuit is also configured to remove the hold voltage from the selected dummy line after the first time period such that an electric potential of the selected dummy line rises to a first voltage, wherein the first voltage is higher than the word-line voltage. The peripheral circuit is further configured to increase the first time period incrementally in each of subsequent erase loops.

In some implementations, the first voltage decreases incrementally in each of the subsequent erase loops.

In some implementations, the erase voltage is increased incrementally in each of the subsequent erase loops.

In some implementations, the erase voltage is increased by an erase step voltage in each of the subsequent erase loop.

In some implementations, the peripheral circuit is further configured to apply a further hold voltage to an unselected dummy line for a second time period; and remove the further hold voltage from the unselected dummy line after the second time period such that a further electric potential of the unselected dummy line rises to a second voltage higher than the first voltage.

In some implementations, the unselected dummy line comprises a top select gate.

In some implementations, the second time period is shorter than the first time period.

In some implementations, the further hold voltage and the hold voltage have same magnitudes.

In some implementations, the hold voltage and the word-line voltage have same magnitudes.

In some implementations, the peripheral circuit is further configured to perform a verify operation to determine whether the first set of memory cells and the second set of memory cells are at an erased state.

In some implementations, the peripheral circuit is further configured to proceed to a subsequent erase loop when the first set of memory cells and/or the second set of memory cells fail the verification.

Yet another aspect of the present disclosure provides a storage system. The storage system includes a memory controller configured to issue an erase command; and a memory device configured to perform erasing according to the erase command. The memory device includes an array of memory cells arranged in a plurality of rows; a plurality of word lines respectively coupled to the plurality of rows of the memory cells; and a peripheral circuit coupled to the plurality of word lines. The peripheral circuit is configured to apply an erase voltage to a common source line and/or bit lines of the memory device; and apply a word-line voltage to the plurality of word line, wherein a first set of memory cells coupled to the plurality of word lines are each configured to store a first number of bits data. The peripheral circuit is also configured to apply a hold voltage to a selected dummy line of the memory device for a first time period, wherein a second set of memory cells coupled to the selected dummy line are each configured to store a second number of bits data, and the second number is less than the first number. The peripheral circuit is further configured to remove the hold voltage from the selected dummy line after the first time period such that an electric potential of the selected dummy line rises to a first voltage, wherein the first voltage is higher than the word-line voltage. The peripheral circuit is also configured to increase the first time period incrementally in each of subsequent erase loops.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
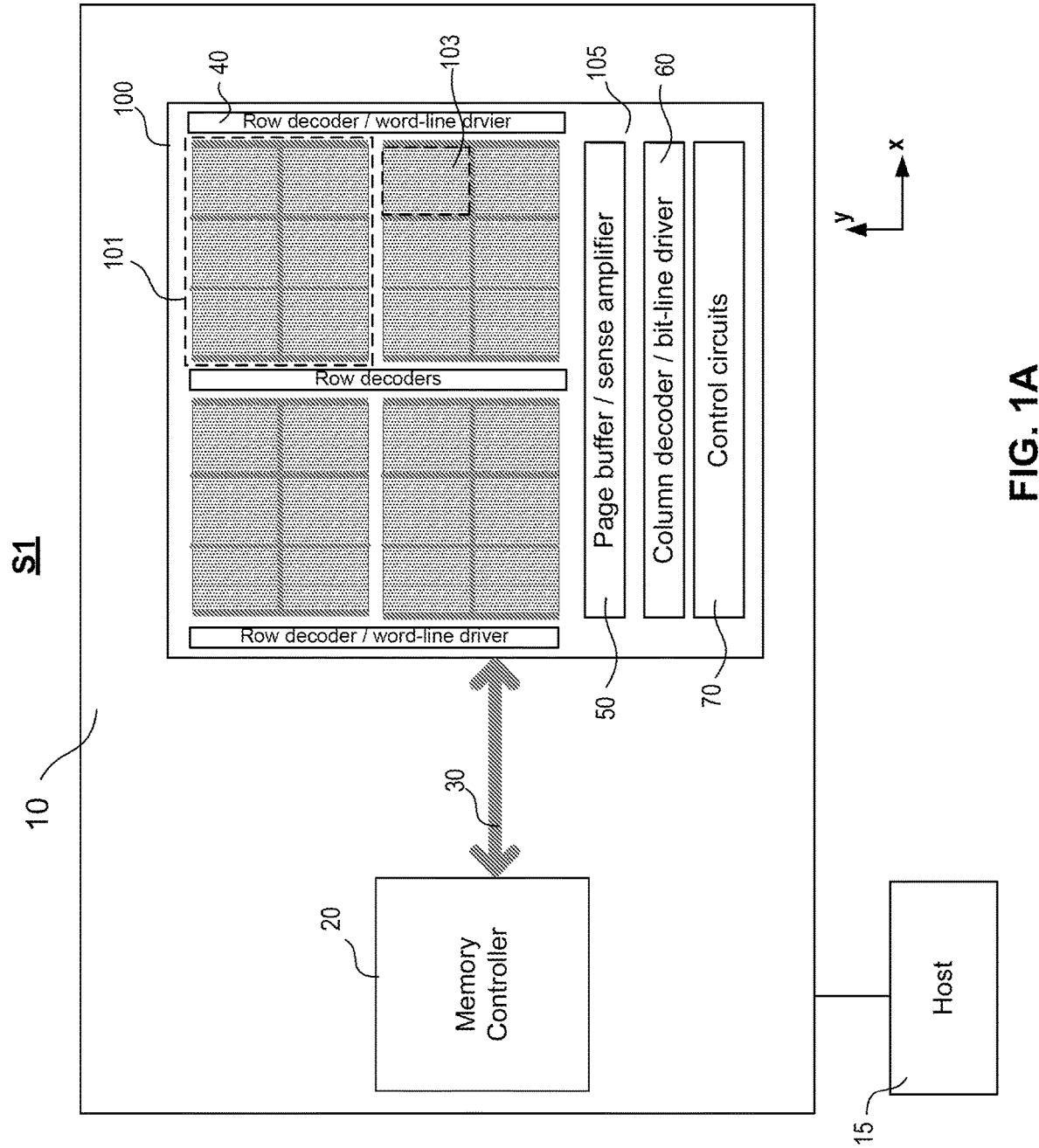
FIG. 1A illustrates a storage system with one or more NAND flash memories, according to some embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

FIG. 1A illustrates a block diagram of an exemplary electronic apparatus S1 having a memory system 10, according to some embodiments of the present disclosure. The electronic apparatus S1 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The memory system 10 includes a NAND memory device 100 and a memory controller 20, where the NAND memory device 100 can include any NAND memory device described below in the present disclosure. The memory system 10 can communicate with a host 15 through the memory controller 20, where the memory controller 20 can be connected to the NAND memory device 100 via a memory channel 30. In some embodiments, the memory system 10 can have more than one NAND memory device 100, while each NAND memory device 100 can be managed by the memory controller 20.

In some embodiments, the host 15 can include a processor of an electronic device, such as a central processing unit (CPU), or a system-on-chip (SoC), such as an application processor (AP). The host 15 sends data to be stored at the memory system 10 or retrieves data by reading the memory system 10.

The memory controller 20 can handle I/O requests received from the host 15, ensure data integrity and efficient storage, and manage the NAND memory device 100. The memory channel 30 can provide data and control communication between the memory controller 20 and the NAND memory device 100 via a data bus. In one example, the memory controller can issue a read, program or erase command such that a read, program or erase operation can be performed for NAND memory device 100.

Figure 1B:
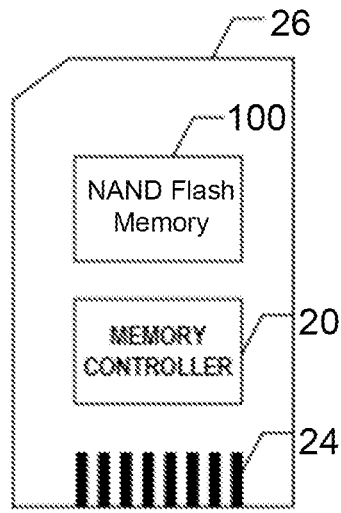
FIGS. 1B and 1C illustrate exemplary storage systems with one or more NAND flash memories, according to some embodiments of the present disclosure.
Figure 1C:
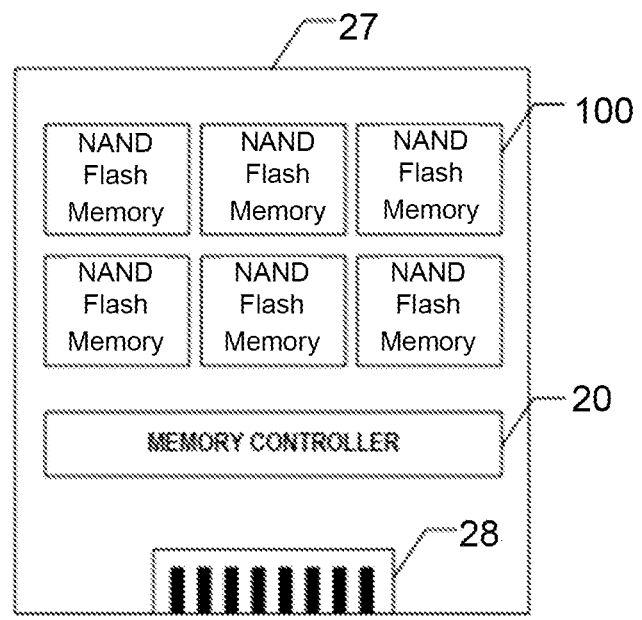

Memory controller 20 and one or more NAND memory device 100 can be integrated into various types of storage devices, for example, be included in the same package, such as a universal Flash storage (UFS) package or an eMMC package. That is, memory system 10 can be implemented and packaged into different types of end electronic products. In one example as shown in FIG. 1B, memory controller 20 and a single NAND memory device 100 can be integrated into a memory card 26. Memory card 26 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 26 can further include a memory card connector 24 coupling memory card 26 with a host (e.g., the host 15 in FIG. 1A). In another example as shown in FIG. 1C, memory controller 20 and multiple NAND memory devices 100 can be integrated into a solid state drive (SSD) 27. SSD 27 can further include an SSD connector 28 coupling SSD 27 with a host (e.g., the host 15 in FIG. 1A).

Referring to FIG. 1A, the NAND memory device 100 (i.e., "flash," "NAND flash" or "NAND") can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1A, the exemplary NAND memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. As shown in FIG. 1A, the bit lines and word lines can be laid out along x-direction and y-direction, respectively. In this disclosure, one or more memory block 103 can also be referred to as the "memory array" or "array." The memory array is the core area in a memory device, performing storage functions.

The NAND memory device 100 also includes a peripheral region 105, an area surrounding memory planes 101. The peripheral region 105, also named as peripheral circuits, contains many digital, analog, and/or mixed-signal circuits to support functions of the memory array, for example, page buffers/sense amplifiers 50, row decoders/word line drivers 40, column decoders/bit line drivers 60, and control circuits 70. Control circuits 70 include register, active and/or passive semiconductor devices, such as transistors, diodes, capacitors, resistors, etc., as would be apparent to a person of ordinary skill in the art. The control circuits 70 of the peripheral region 105 can be configured to initiate a read or program operation on a select memory cell of a NAND memory string in the memory block 103. In some implementations, the control circuits 70 receives a read, program or erase command from a memory controller (e.g., memory controller 20) through interface, and in response, sends control signals to at least row decoder/word-line driver 40, column decoder/bit-line driver 60, and voltage generators deposed in the peripheral region 105 to initiate the read or program operation on the select memory cell.

It is noted that the layout of the electronic components in the memory system 10 and the NAND memory device 100 in FIG. 1A are shown as an example. The memory system 10 and the NAND memory device 100 can have other layout and can include additional components. For example, The NAND memory device 100 can also have high-voltage charge pumps, I/O circuits, etc. The memory system 10 can also include firmware, data scrambler, etc. In some implementations, the peripheral circuit region 105 and the memory array can be formed independently on separate wafers and then connected with each other through wafer bonding.

Figure 2:
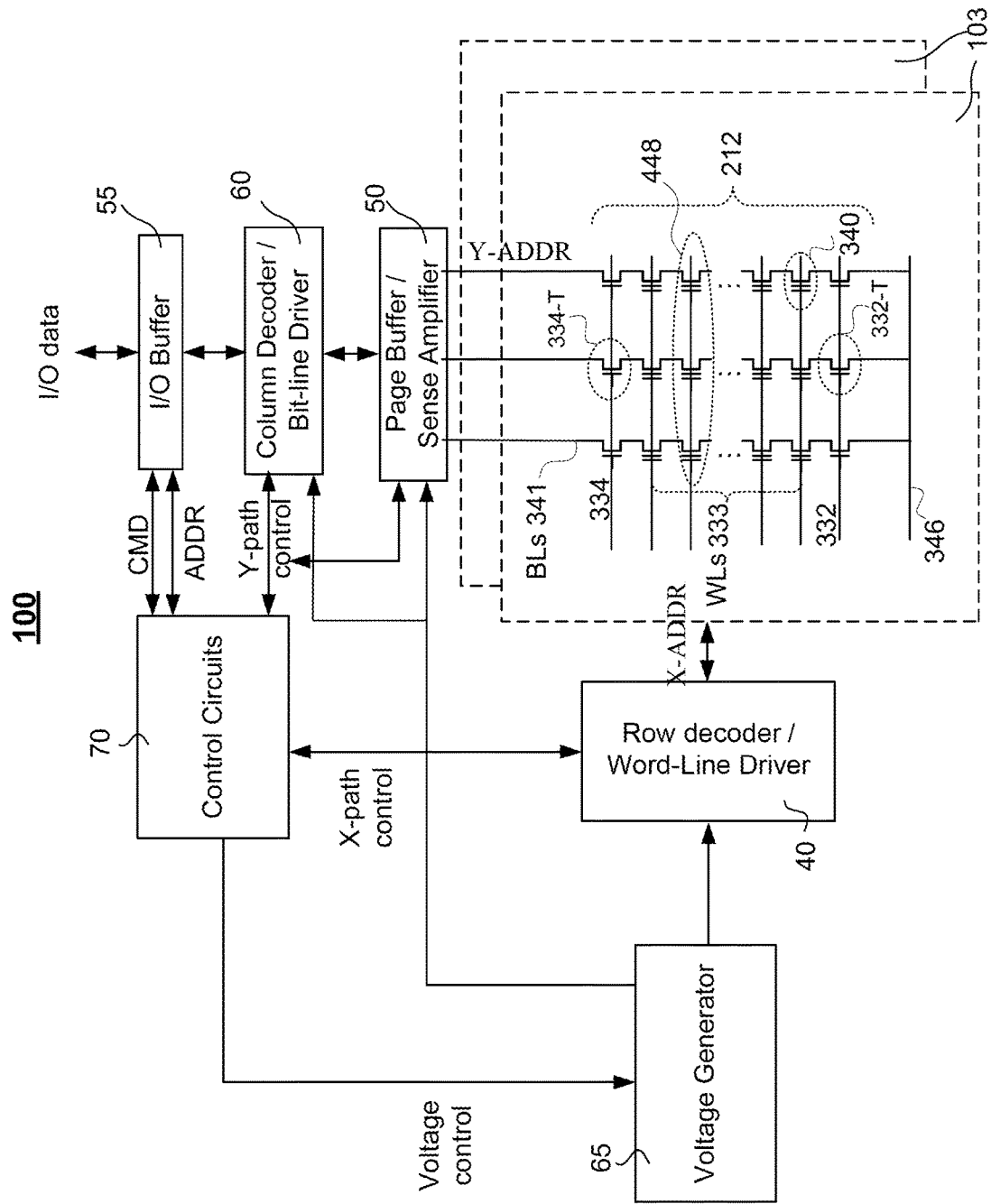
FIG. 2 shows a schematic circuit diagram of a NAND memory device, according to some embodiments of the present disclosure.

FIG. 2 shows a schematic diagram of the NAND memory device 100, according to some embodiments of the present disclosure. The NAND memory device 100 includes one or more memory blocks 103. Each memory block 103 includes memory strings 212. Each memory string 212 includes memory cells 340. The memory cells 340 sharing the same word line forms a physical memory page 448. The memory string 212 can also include at least one field effect transistor (e.g., MOSFET) at each end, which is controlled by a bottom select gate (BSG) 332 and a top select gate (TSG) 334, respectively. The drain terminal of a top select transistor 334-T can be connected to the bit line 341, and the source terminal of a bottom select transistor 332-T can be connected to an array common source (ACS) 446. The ACS 446 can be shared by the memory strings 212 in an entire memory block, and is also referred to as the common source line.

The NAND memory device 100 can also include a peripheral circuit that includes many digital, analog, and/or mixed-signal circuits to support functions of the memory block 103, for example, a page buffer/sense amplifier 50, a row decoder/word line driver 40, a column decoder/bit line driver 60, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

The memory blocks 103 can be coupled with the row decoder/word line driver 40 via word lines ("WLs") 333, bottom select gates ("BSGs") 332 and top select gates ("TSG") 334. The memory blocks 103 can be coupled with the page buffer/sense amplifier 50 via bit lines ("BLs") 341. The row decoder/word line driver 40 can select one of the memory blocks 103 on the NAND memory device 100 in response to an X-path control signal provided by the control circuit 70. The row decoder/word-line driver 40 can transfer voltages provided from the voltage generator 65 to the word lines 333 according to the X-path control signal. During the read and program operation, the row decoder/word-line driver 40 can transfer a read voltage Vread and a program voltage Vpgm to a selected word line and a pass voltage Vpass to an unselected word line according to the X-path control signal received from the control circuit 70.

The column decoder/bit-line driver 60 can transfer an inhibit voltage $V_{inhibit}$ to an unselected bit line and connect a selected bit line to ground according to a Y-path control signal received from the control circuit 70. In the other words, the column decoder/bit-line driver 60 can be configured to select or unselect one or more memory strings 212 according to the Y-path control signal from the control circuit 70. The page buffer/sense amplifier 50 can be configured to read and program (write) data from and to the memory block 103 according to the control signal Y-path control from the control circuit 70. For example, the page buffer/sense amplifier 50 can store one or more logic pages of data to be programmed into one physical memory page 448. In another example, page buffer/sense amplifier 50 can perform verify operations to ensure that the data has been properly programmed into each memory cell 340. In yet another example, during a read operation, the page buffer/sense amplifier 50 can sense current flowing through the bit line 341 that reflects the logic state (i.e., data) of the memory cell 340 and amplify small signal to a measurable magnification.

The input/output buffer 55 can transfer the I/O data from/to the page buffer/sense amplifier 50 as well as addresses ADDR or commands CMD to the control circuit 70. In some embodiments, the input/output buffer 55 can function as an interface between the memory controller 20 (in FIG. 1A) and the NAND memory device 100.

The control circuit 70 can control the page buffer/sense amplifier 50 and the row decoder/word-line driver 40 in response to the commands CMD transferred by the input/ output buffer 55. During the programming operation, the control circuit 70 can control the row decoder/word-line driver 40 and the page buffer/sense amplifier 50 to program a target memory cell by selecting a word line and a bit line. The target memory cell addressed by the selected word line and the selected bit line can thereby programmed. During the read operation, the control circuit 70 can control the row decoder/word-line driver 40 and the page buffer/sense amplifier 50 to read the target memory cell. The X-path control signal and the Y-path control signal include a row address X-ADDR and a column address Y-ADDR that can be used to locate the target memory cell in the memory block 103. The row address X-ADDR can include a page index, a block index and a plane index to identify the physical memory page 448, memory block 103, and memory plane 101 (in FIG. 1A), respectively.

In some implementations, the control circuit 70 can include one or more control logic unit. Each control logic unit described herein can be either a software module and/or a firmware module running on a processor, such as a microcontroller unit (MCU), which is part of the control circuit 70, or a hardware module of a finite-state machine (FSM), such as an integrated circuit (IC, e.g., application-specific IC (ASIC), field-programmable gate array (FPGA), etc.), or a combination of software module, firmware module, and hardware module.

The voltage generator 65 can generate voltages to be supplied to word lines and bit lines under the control of the control circuit 70. The voltages generated by the voltage generator 65 include the read voltage Vread, the program voltage Vpgm, the pass voltage Vpass, the inhibit voltage $V_{inhibit}$, etc.

In some embodiments, the NAND memory device 100 can be formed based on the floating gate technology. In some embodiments, the NAND memory device 100 can be formed based on charge trapping technology. The NAND memory device based on charge trapping can provide high storage density and high intrinsic reliability. Storage data or logic states (e.g., threshold voltage $V_{th}$ of the memory cell 340) depends on the amount of charge trapped in a storage layer. In some embodiments, the NAND memory device 100 can be a three-dimensional (3D) memory device, where the memory cells 340 can be vertically stacked on top of each other.

Figure 3:
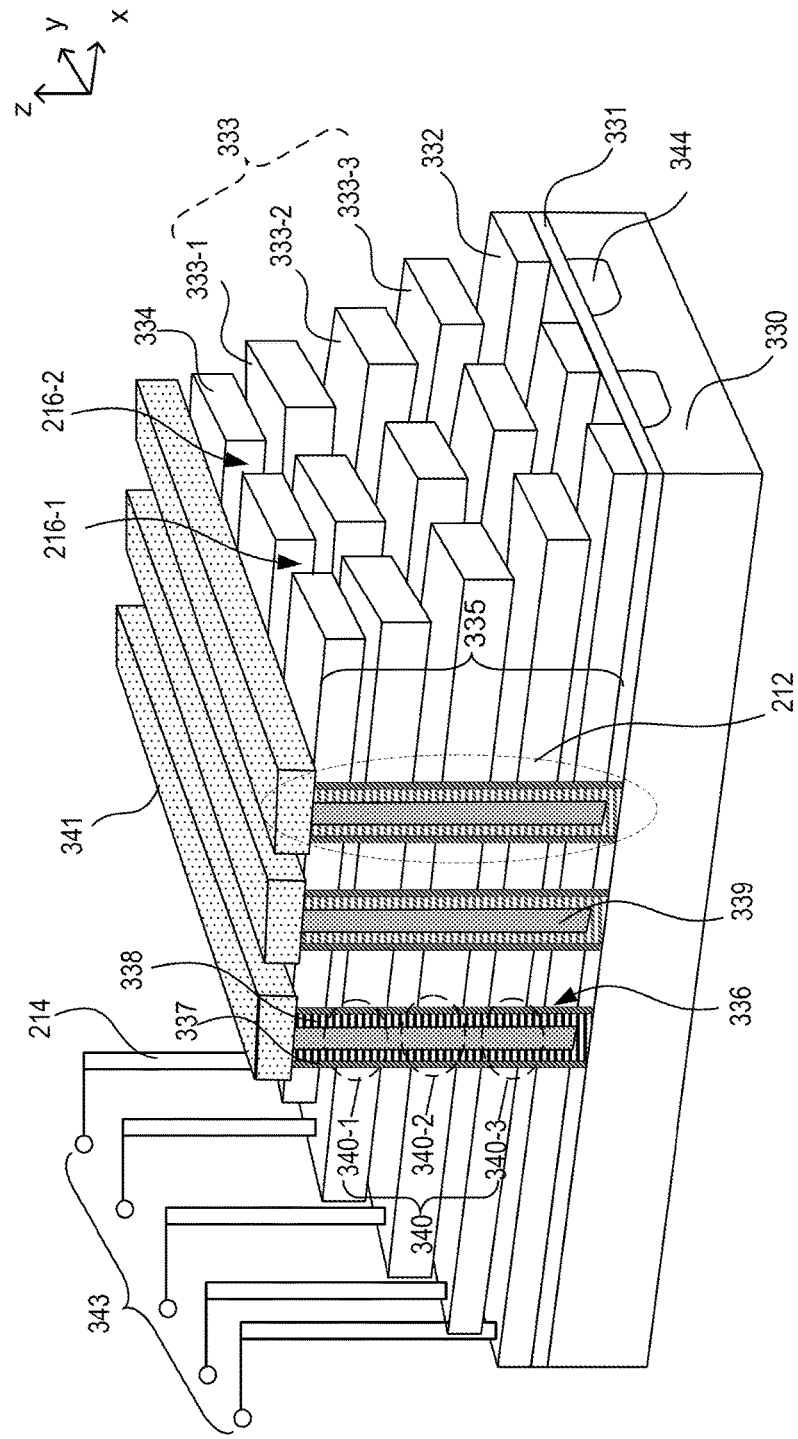
FIG. 3 illustrates a perspective view of a three-dimensional (3D) NAND memory device, in accordance with some embodiments of the present disclosure.

FIG. 3 illustrates a perspective view of a 3D NAND memory device 300, according to some embodiments of the present disclosure. The 3D NAND memory device 300 can be a portion of the NAND memory device 100 shown in FIG. 1A and can include a substrate 330, an insulating film 331 over the substrate 330, a tier of bottom select gates (BSGs) 332 over the insulating film 331, and tiers of control gates 333, also referred to as "word lines (WLs)," stacking on top of the BSGs 332 to form a film stack 335 of alternating conductive and dielectric layers in a z-direction. The dielectric layers adjacent to the tiers of control gates are not shown in FIG. 3 for clarity.

The control gates of each tier are separated by slit structures 216-1 and 216-2 through the film stack 335 in the x-direction (e.g., the word line direction). The 3D NAND memory device 300 also includes a tier of top select gates (TSGs) 334 over the stack of control gates 333. The stack of TSG 334, control gates 333 and BSG 332 is also referred to as "gate electrodes". The 3D NAND memory device 300 further includes memory strings 212 and doped source line regions 344 in portions of substrate 330 between adjacent BSGs 332. Each memory strings 212 includes a channel hole 336 extending through the insulating film 331 and the film stack 335 of alternating conductive and dielectric layers in the z-direction. Memory strings 212 also includes a memory film 337 on a sidewall of the channel hole 336, a channel layer 338 over the memory film 337, and a core filler 339 surrounded by the channel layer 338. The memory film 337 can include a barrier layer, a storage layer and a tunnel layer, where the storage layer of the memory film can be used to store electronic charges (e.g., electrons or holes). A memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel of the memory cell. The 3D NAND memory device 300 further includes bit lines (BLs) 341 that extend in the y-direction (e.g., the bit line direction) and are connected with the memory strings 212 over the TSGs 334. The 3D NAND memory device 300 also includes metal interconnect lines 343 connected with the gate electrodes through contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of BSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. And the TSG 334 and BSG 332 can have more than one tier. The 3D NAND memory device 300 can also include other structures, for example, TSG cut, common source contact, array common source and dummy memory string. These structures are not shown in FIG. 3 for simplicity.

In a NAND memory device, read and programming operations can be performed to all memory cells 340 sharing the same word line, i.e., in the same physical memory page 448 in FIG. 2. In one example, a NAND memory device can be configured to operate in a single-level cell (SLC) mode. In this example, the memory cell 340 can be in an erased state ER or a programmed state P1. Initially, all memory cells 340 in the memory array 103 can be reset to the erased state ER as logic "1" by implementing a negative voltage difference between the control gates 333 and source terminals of the memory cells (e.g., the array common source 446) such that all the trapped electronic charges in the storage layer of the memory cells 340 can be removed. For example, the negative voltage difference can be induced by setting the control gates 333 of the memory cells 340 to ground, and applying a high positive voltage to the array common source 446. At the erased state ER ("state ER"), the threshold voltage $V_{th}$ of the memory cells 340 can be reset to the lowest value, and can be measured or sensed at the bit line 341. During programming (i.e., writing), the program voltage Vpgm (e.g., a positive voltage pulse between 10 V and 25 V) can be applied on the control gate 333 such that electronic charges (e.g., electrons) can be injected into the storage layer of the memory cell 340, and thereby increase the threshold voltage $V_{th}$ of the memory cell 340. Thus the memory cell 340 can be programmed to the programmed state P1 (also referred to as state P1).

To increase storage capacity, a NAND memory device can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states (or "states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER, and states P1-P7. In the QLC mode, a memory cell stores 4 bits and has 16 states (i.e., state ER and states P1-P15). In general, a memory cell in an xLC mode can have $2^n$ states and can store n-bit of data, where n is a whole number. For example, n equals 1, 2, 3, and 4 for SLC, MLC, TLC and QLC mode, respectively.

Figure 4:
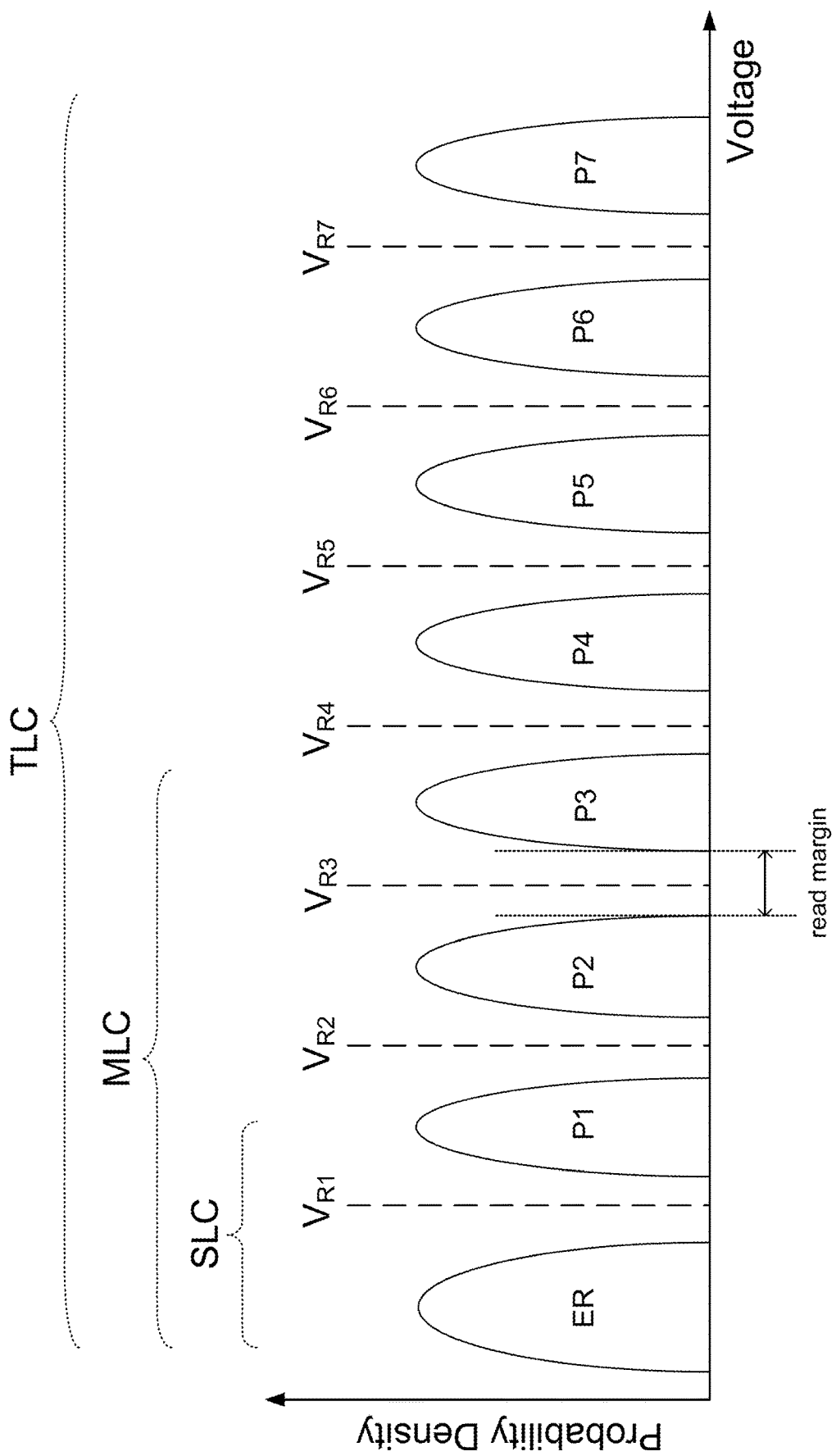
FIG. 4 illustrates a threshold voltage $V_{th}$ distribution of a NAND memory device, according to some embodiments of the present disclosure.

FIG. 4 illustrates a threshold voltage $V_{th}$ distribution of a NAND memory device programmed in the xLC mode, according to some embodiments of the present disclosure. Due to various variations, each state of the memory cells includes a range of threshold voltages $V_{th}$, where the threshold voltage $V_{th}$ distribution of each state can be represented by a probability density. In some embodiments, each state of the xLC mode (SLC, MLC, TLC, QLC, etc.) can be programmed by using an incremental step pulse programming (ISPP) scheme where the program voltage Vpgm can be incrementally increased by adding a step pulse $V_{step}$. For example, the eight TLC states can be programmed from the state ER to the state P1 having a lower threshold voltage first, and then state P2, P3, . . . , to the state P7 having a higher threshold voltage. In some embodiment, the $2^n$ states of the xLC mode can be programmed from the state ER to the state P1, P2, . . . , P($2^n$-1) sequentially. As shown in FIG. 4, from the state ER to the state P($2^n$-1), threshold voltage $V_{th}$ of the memory cell increases. Therefore, the state ER is also referred to as a lowest state and the state P($2^n$-1) is also referred to as a highest state. A higher state has higher threshold voltages and a lower state has lower threshold voltages.

The state of a memory cell can be determined by comparing the threshold voltage $V_{th}$ of the memory cell with one or more read reference voltages VR (e.g., $V_{R1}$, $V_{R2}$, . . . ). State or data stored in the memory cells can thereby be determined. A read reference voltage VR can be selected within a read margin between two adjacent states, i.e., between a highest possible threshold voltage of a lower state and a lowest possible threshold voltage of a higher state. Using the eight TLC states ER and P1-P7 in FIG. 4 as an example, by applying the read reference voltages $V_{R1}$-$V_{R7}$ to the control gate of a target memory cell, the range of the memory cell's threshold voltage $V_{th}$ can be determined. For example, to verify if a target memory cell is at state ER, the read reference voltage $V_{R1}$ can be used. If the target memory cell is at state ER, the threshold voltage $V_{th}$ of the target memory cell is lower than the read reference voltage $V_{R1}$. The target memory cell can be switch on and form a conductive path in the channel. If the target memory cell is at any one of the states P1-P7, the threshold voltage $V_{th}$ of the target memory cell is higher than the read reference voltage $V_{R1}$. The target memory cell is thereby switched off. By measuring or sensing the current through the target memory cell at the corresponding bit line, the threshold voltage $V_{th}$ or the state of the target memory cell can be determined.

To determine the two states ER and P1 stored in the SLC mode, only the read reference voltage $V_{R1}$ is needed. To determine the four states ER and P1-P3 in the MLC mode, the read reference voltages $V_{R1}$, $V_{R2}$ and $V_{R3}$ can be used. To determine the eight states ER and P1-P7 for the TLC mode, the read reference voltages $V_{R1}$-$V_{R7}$ can be used. For example, in the TLC mode, the threshold voltage of state ER is below $V_{R1}$, and the threshold voltage of state P7 is above $V_{R7}$, where the threshold voltages of state P1 is between $V_{R1}$ and $V_{R2}$. States P2-P6 can be determined similarly. Likewise, in the QLC mode, 15 read reference voltages can be used to verify the 16 states (ER and P1-P15). To verify the $2^n$ states in the xLC mode, $2^n$-1 number of read reference voltages can be used. In some embodiments, a SLC read can be performed to separate two groups of logic states using a single read reference voltage. For example, by comparing threshold voltages of the memory cells with the read reference voltage $V_{R4}$, states ER and P1-P3 can be separated from states P4-P7.

Figure 5:
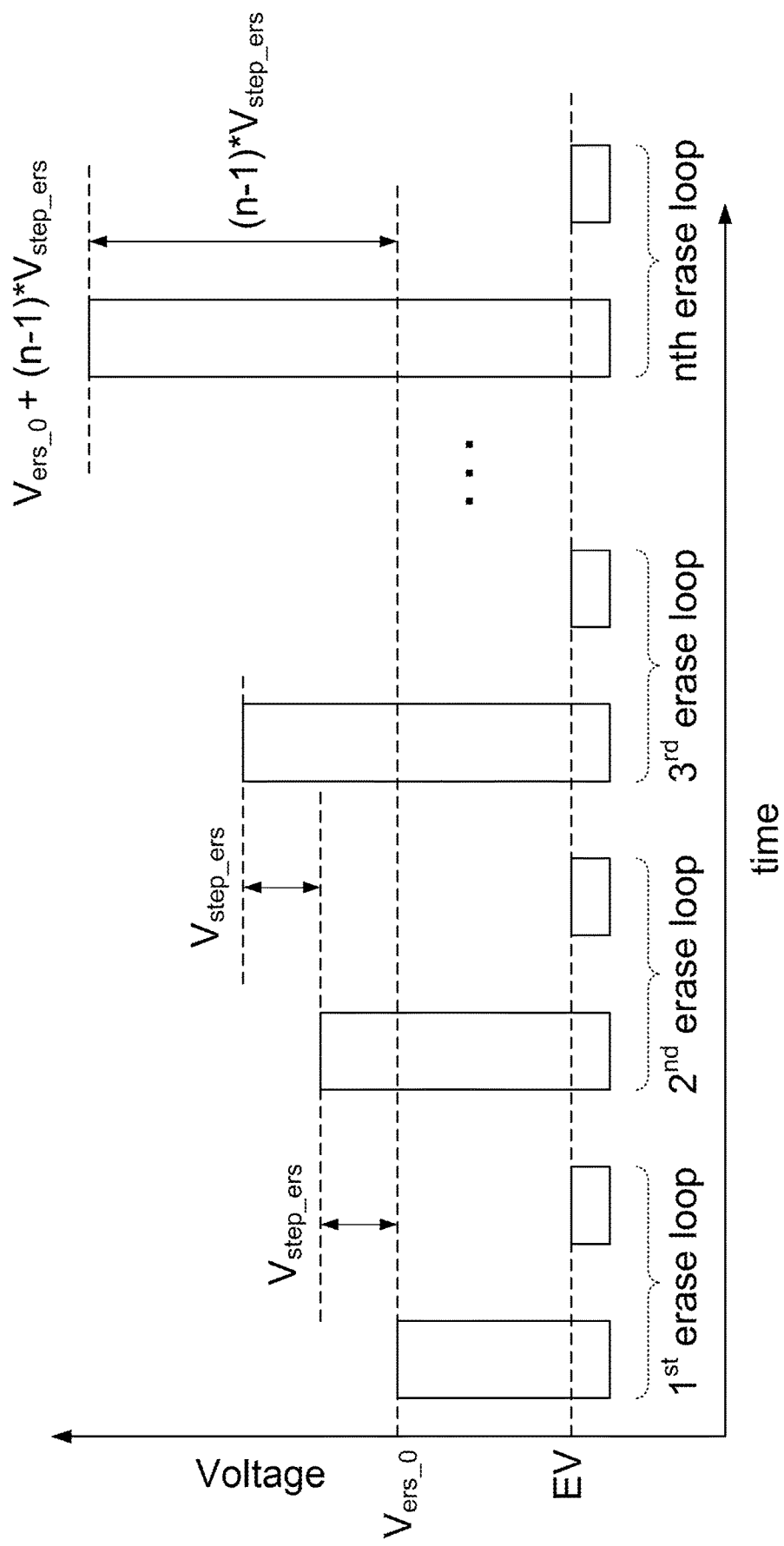
FIG. 5 illustrates an incremental step pulse erase (ISPE) scheme, according to some embodiments of the present disclosure.

FIG. 5 illustrates an incremental step pulse erase (ISPE) scheme to perform erase and erase verification operations on the memory cells in a memory block, according to some embodiments of the present disclosure. In this example, the memory cells can implement the xLC mode and each memory cell can have $2^n$ states. The ISPE scheme starts with a first erase loop including an erase operation and an erase verification operation. During the erase operation, a pulse with an initial erase voltage $V_{ers\_0}$ can be applied to all the memory cells in a memory block (e.g., the memory block 103 in FIG. 1A) to reset the memory cells to the state ER. During the erase verification operation, another pulse with an erase verification voltage EV can be applied to the memory cells to determine whether the memory cells are in the state ER. The initial erase voltage $V_{ers\_0}$ can be in a range between 15 V to 23 V, and the erase verification voltage EV can be in a range between −3 V to 2 V. In some embodiments, the initial erase voltage $V_{erase}$ can be 17 V, and the erase verification voltage EV can be 0.5V. To determine if the memory cells are at the state ER, or if the erase operation is completed successfully, the erase verification voltage EV can be applied to the word lines of the memory cells. If the erase verification voltage EV is higher than the threshold voltage of the memory cell (see FIG. 4), it can be determined that the memory cell is at the state ER. If all the memory cells in the memory block or a predetermined number of memory cells are at the state ER, it is considered that the memory block passes the erase verification operation (or erase verification). Otherwise, a second erase loop can be implemented.

The erase verification operation is similar to the read operation. If the erase verification voltage EV applied to the word line is higher than the threshold voltage of the memory cell, the memory cell is switched on. If the erase verification voltage EV applied to the word line is lower than the threshold voltage of the memory cell, the memory cell is switched off. By sensing the current flowing through the memory cell, the erase verification voltage EV applied on the word line can be compared with the threshold voltage of the memory cell. Whether the memory cell is reset to the state ER can thereby be determined.

In the second erase loop, an erase step voltage $V_{step\_ers}$ can be added to the initial erase voltage $V_{ers\_0}$ during the erase operation and the erase verification operation can be performed afterwards. In the other words, the memory cells can be erased by a pulse having a higher voltage. The erase voltage $V_{erase}$ in the second erase loop can be expressed as $V_{erase}=V_{ers\_0}+V_{step\_ers}$. In each subsequent erase loop, the erase voltage $V_{erase}$ is increased incrementally with the erase step voltage $V_{step\_ers}$. In a final erase loop (or an nth erase loop), the erase voltage $V_{erase}$ can be increased by a voltage of (n−1)*$V_{step\_ers}$ and can be expressed as $V_{erase}=V_{ers\_0}+$ (n−1)*$V_{step\_ers}$, where n is a whole number, representing a number of erase loops used in the ISPE scheme. In some embodiments, the erase step voltage $V_{step\_ers}$ can be in a range between 0.1 V to 1.2 V.

During the erase operation, the erase voltage $V_{erase}$ can be applied to erase all the memory cells in the same memory block. In some embodiments, the erase voltage $V_{erase}$ can be applied to the ACS 346 (also referred to as common source line) as shown in FIG. 2. In some embodiments, the erase voltage $V_{erase}$ can also be applied to the bit lines 341. In some embodiments, the NAND memory device 100 can have a three-dimensional structure as shown in FIG. 3. In this example, the NAND memory device can also include an additional transistor at each end of the memory string to facilitate the erase operation, where the additional transistor can introduce gate-induced drain leakage (GIDL).

Figure 6:
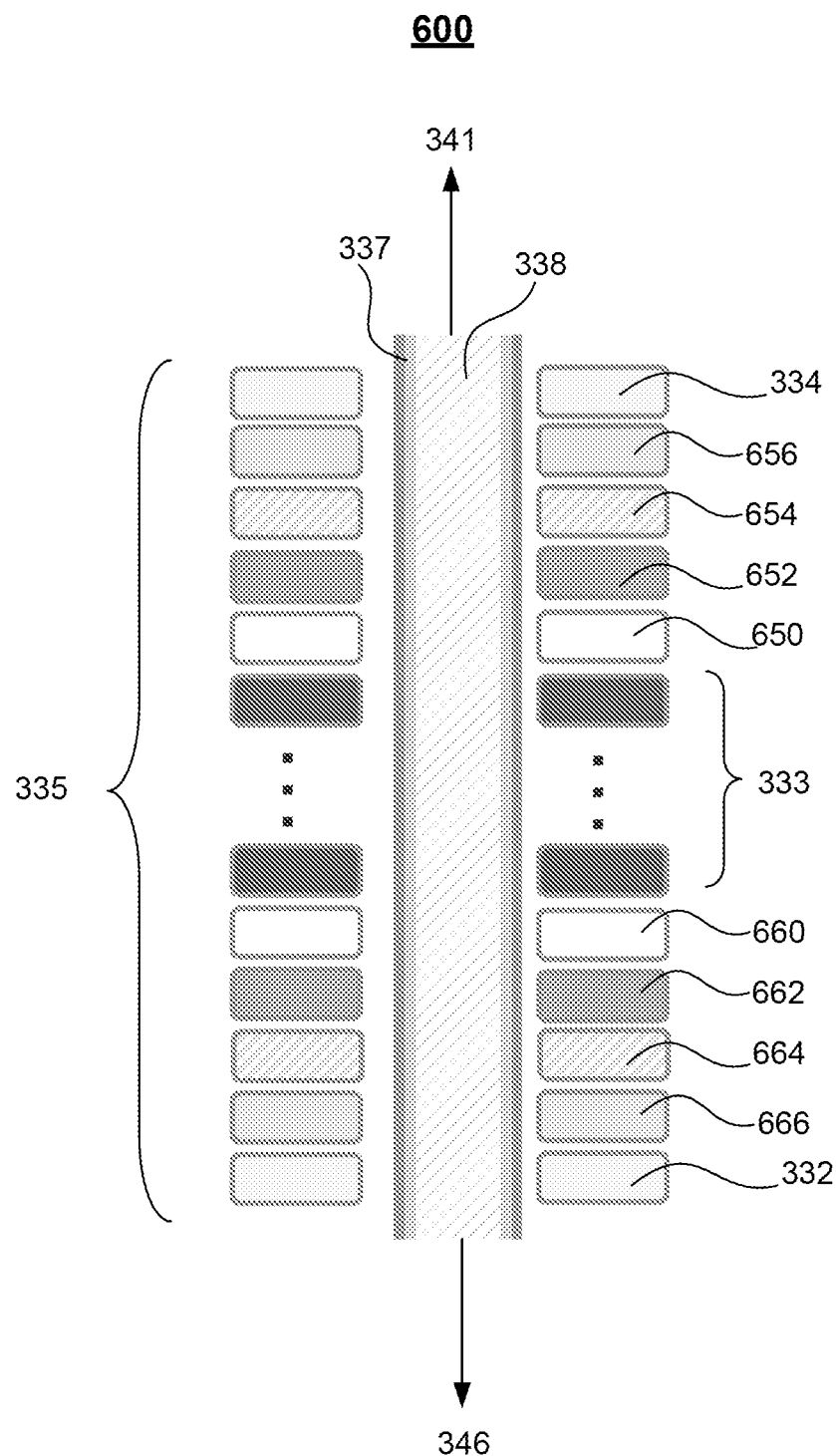
FIG. 6 illustrates a cross-sectional view of a 3D NAND memory device, according to some embodiments of the present disclosure.

FIG. 6 illustrates a cross-sectional view 600 of a 3D NAND memory device, according to some embodiments of the present disclosure. In addition to the word lines 333 in the middle, the BSG 332 at the bottom and the TSG 334 on the top, the gate electrodes in the film stack 335 of alternating conductive and dielectric layers can also include top edge lines and bottom edge lines adjacent to the word lines 333, for example, first top edge line 650, second top edge line 652, first bottom edge line 660 and second bottom edge line 662. The first top edge line 650 and the first bottom edge line 660 are closer to the word lines 333 in the middle of the film stack 335 than the second top edge line 652 and the second bottom edge line 662. The film stack 335 of alternating conductive and dielectric layers can also include top dummy lines between the top edge lines and the TSG 334, for example, first top dummy line 654 and second top dummy line 656. Similarly, the film stack 335 can also include bottom dummy lines between the bottom edge lines and the BSG 332, for example, first bottom dummy line 664 and second bottom dummy line 666. The first top dummy line 654 and the first bottom dummy line 664 are closer to the top edge lines 650/652 and the bottom edge lines 660/662, respectively, than the second top dummy line 656 and the second bottom dummy line 666. In some embodiments, the top dummy lines and the bottom dummy lines are respectively closer to a top surface or a bottom surface of the film stack 335 than the word lines 333. For illustration purpose, only two edges lines and two dummy lines are shown on each end of the film stack 335 in FIG. 6. It is noted that the number of dummy lines and edges lines are not so limited and can be any suitable number.

To increase storage capacity, the number of vertically stacked gate electrodes and memory cells has been increased greatly. Additionally, more bits can be stored per memory cell. For example, in the QLC mode, each memory cell can store 4 bits. However, to improve reliability, less bits (e.g., 3 bits, 2 bits or 1 bit) can be stored in the memory cells coupled to the edge lines (e.g., top edge lines 650/652 and bottom edge lines 660/662). Namely, the memory cells coupled to the edge lines can operate in a different storage mode (e.g., store less bits) than the memory cells coupled to the word lines 333 located in the middle of the film stack 335. In one example, the memory cells coupled to the first top edge line 650 and the first bottom edge line 660 can operation in the QLC mode and can store 4 bit per memory cell. The memory cells coupled to the second top edge line 652 and the second bottom edge line 662, which are farther away from the word lines 333, can operate in the TLC mode and can store 3 bit per memory cell. In another example, the memory cells coupled to the first top edge line 650 and the first bottom edge line 660 can operation in the TLC mode and can store 3 bit per memory cell. The memory cells coupled to the second top edge line 652 and the second bottom edge line 662, which are farther away from the word lines 333, can operate in the MLC mode and can store 2 bit per memory cell. And so on.

Reducing stored bits in the memory cells coupled to the edge lines can reduce the storage capacity of the 3D NAND memory device. To compensate the reduced storage capacity, memory cells coupled to the dummy lines can also be programmed to store data. For example, while the second top dummy line 656 and the second bottom dummy line 666 can be left unused, memory cells coupled to the first top dummy line 654 and the first bottom dummy line 664 can operate, for example, in the SLC mode and store 1 bit per memory cell. Thus, memory cells coupled to different gate electrodes in the film stack 335 can be programmed to different storage modes and store different number of bits. During erase operation, the memory cells in the same memory block can be erased simultaneously.

Figure 7:
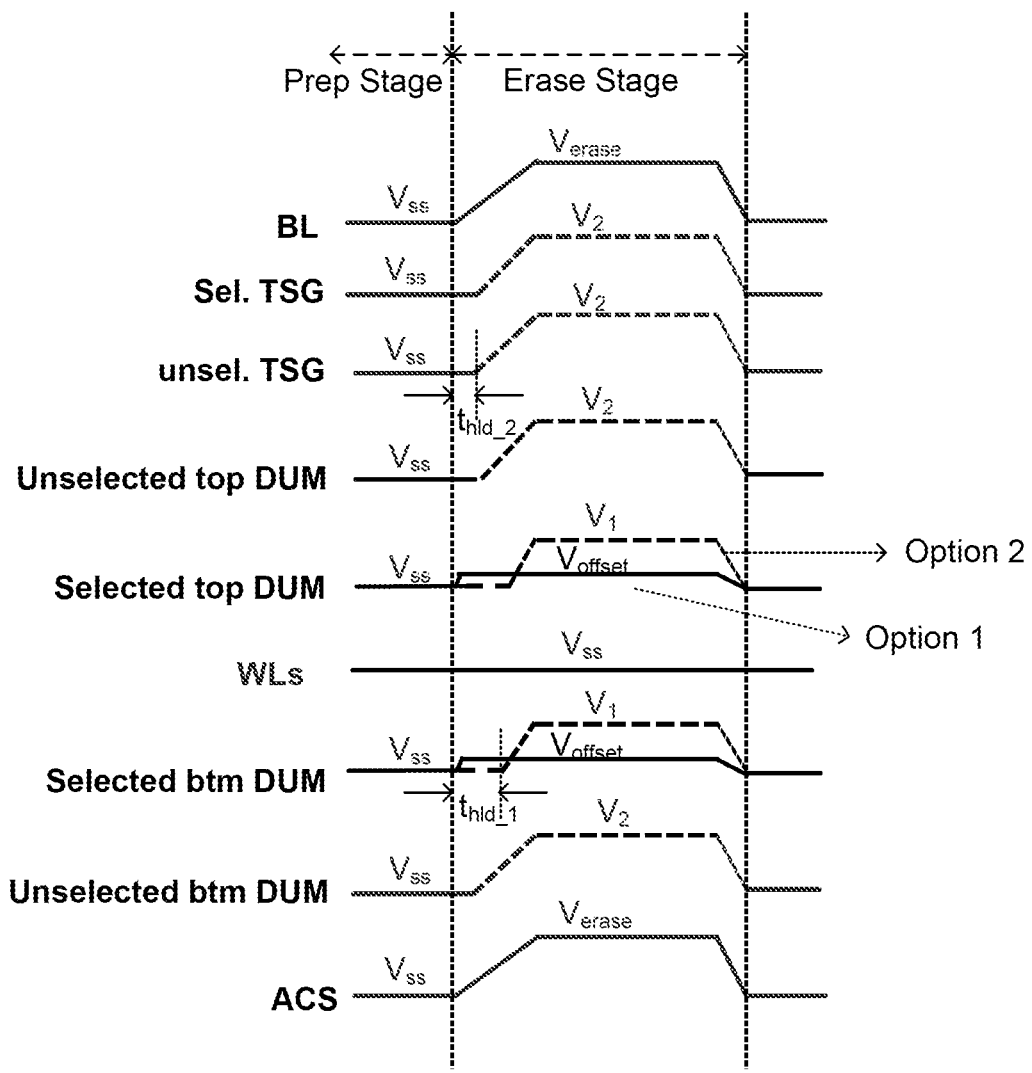
FIG. 7 illustrates waveforms of gate electrodes for an erase operation for a 3D NAND memory device, according to some embodiments of the present disclosure.

FIG. 7 illustrates waveforms 700 of the gate electrodes for an erase operation for a 3D NAND memory device, according to some embodiments of the present disclosure. The erase operation includes a prep stage and an erase stage. During the prep stage, all the electrodes can be set at a word-line voltage (also referred to as a source supply voltage $V_{ss}$), e.g., at zero voltage. In another implementation (not shown in FIG. 7), during the prep stage, voltages applied to the word lines and the top select gates can be similar, which can be different from voltages applied to the bit lines and ACS. During the erase stage, the erase voltage $V_{erase}$ can be applied to the ACS 346 (as shown in FIG. 2). In some embodiments, the erase voltage $V_{erase}$ can also be applied to the bit line 341, where gate-induced drain leakage (GIDL) current can be used to facilitate the erase processing. The word lines 333 (also referred to as a first set of gate electrodes) of the memory cells in the same memory block that share the same ACS can be kept at the source supply voltage $V_{ss}$ (e.g., 0 V). During erase stage, electric potential of the channel layers 338 (see FIG. 6) can be raised to a voltage close to the erase voltage $V_{erase}$ from electrical connections to the ACS (bottom) and/or bit lines (top). With a negative voltage difference between the word lines 333 and the channel layers 338, electrical charges (e.g., electrons) stored in corresponding memory films 337 can be removed or neutralized and a first set of memory cells coupled to the word lines 333 can be reset to the erased state ER. Here, the first set of memory cells coupled to the word lines 333 can be erased at a first effective erase voltage $V_{eff\_WL}$ with a magnitude about $|V_{erase}-V_{ss}|$.

In one example (option 1) as shown in FIG. 7, selected dummy lines (including selected top dummy lines and selected bottom dummy lines) can be applied with a fixed offset voltage $V_{offset}$. Accordingly, a second effective erase voltage $V_{eff\_SelDum}$ (i.e., with a magnitude close to $|V_{erase}-V_{offset}|$) can be obtained between the selected dummy lines (e.g., first top dummy line 654 and first bottom dummy line 664, also referred to as a second set of gate electrodes) and the channel layers 338. Therefore, a second set of memory cells coupled to the selected dummy lines can be erased at the second effective erase voltage $V_{eff\_SelDum}$ with a magnitude about $|V_{erase}-V_{offset}|$, where the second effective erase voltage $V_{eff\_SelDum}$ can be lower than the first effective erase voltage $V_{eff\_WL}$ (with a magnitude about $|V_{erase}-V_{ss}|$) between the word lines and the channel layers when the fixed offset voltage $V_{offset}$ is higher than the source supply voltage $V_{ss}$. As a result, the second set of memory cells coupled to the selected dummy lines (i.e., the second set of gate electrodes) can be erased shallower than the first set of memory cells coupled to the word lines (i.e., the first set of gate electrodes).

Also shown in FIG. 7, a second voltage $V_2$ can be provided to the TSGs 334 (including selected TSG and unselected TSG) and unselected dummy lines (including unselected top dummy lines and unselected bottom dummy lines). The second voltage $V_2$ can be generated by applying a second hold voltage $V_{hld\_2}$ to the TSGs and the unselected dummy lines for a second time period $t_{hld\_2}$ and then removing (or releasing) the second hold voltage $V_{hld\_2}$ subsequently such that the TSGs and the unselected dummy lines are left floating. In FIG. 7, the second hold voltage $V_{hld\_2}$ can be applied to the TSGs 334 and unselected dummy lines at the beginning of the erase stage. In one implementation, the second hold voltage $V_{hld\_2}$ can be the same as the source supply voltage $V_{ss}$. After the second time period $t_{hld\_2}$, the TSGs 334 and the unselected dummy lines can be left floating after the second hold voltage $V_{hld\_2}$ (e.g., $V_{hld\_2}=V_{ss}$) is removed. Electric potentials (dashed lines) of the TSGs 334 and the unselected dummy lines can increase to the second voltage $V_2$ after certain time period due to capacitance couplings to the channel layer 338, bit lines 341 and/or the ACS 346 (see FIG. 6).

The second voltage $V_2$ can be increased by increasing the second hold voltage $V_{hld\_2}$ and/or reducing the second time period $t_{hld\_2}$. And the second voltage $V_2$ can be reduced by decreasing the second hold voltage $V_{hld\_2}$ and/or increasing the second time period $t_{hld\_2}$. As such, the TSGs and the unselected dummy lines can be effectively provided with the second voltage $V_2$ through capacitive coupling, where the second voltage $V_2$ corresponds to the electric potential of the TSGs and the unselected dummy lines when floating. When the second voltage $V_2$ is close to the erase voltage $V_{erase}$, voltage differences (i.e., a third effective erase voltage $V_{eff\_unSelDum}=|V_{erase}-V_2|$) between the TSGs and the channel layer 338 can be very small. Similarly, voltage differences between the unselected dummy lines and the channel layer 338 can also be very small. A third set of memory cells coupled to the unselected dummy lines can thereby avoid being erased after the second time period $t_{hld\_2}$. In addition, a voltage different of $|V_{erase}-V_{hld\_2}|$ that is across the third set of memory cells during the second time period $t_{hld\_2}$, can be limited to the second time period $t_{hld\_2}$. By reducing the second time period $t_{hld\_2}$, the charges (e.g., electrons stored in the memory film of the memory cells) removed due to the voltage different of $|V_{erase}-V_{hld\_2}|$ can also be reduced and vice versa. The third set of memory cells can thereby avoid being erased for an additional reason. Here, unselected dummy lines (e.g., second top dummy line 656 and second bottom dummy line 666) correspond to the third set of memory cells that are not used to store data and do not provide storage functions. The unselected dummy lines can be designed to improve reliability of the 3D NAND memory device.

As discussed above, the second set of memory cells coupled to the selected dummy lines can operate in a storage mode (e.g., SLC mode) that is different from the first set of memory cells coupled to the word lines (e.g., QLC mode). In one example, each of the first set of memory cells coupled to the word lines can store a first number of bits (e.g., 4 bits) and each of the second set of memory cells coupled to the selected dummy lines can store a second number of bits (e.g., 1 bit), where the second number of bits can be less than the first number of bits. During the erase operation, applying different voltages to the gate electrodes coupled to the memory cells of different storage modes can ensure all the memory cells be erased properly, for example, to avoid erasing the memory cells in lower level mode (e.g., SLC) too deeply. Avoiding deep erase can reduce charge trapping in the memory films of the memory cells and thereby reduce disturb to neighboring memory cells. As shown in FIG. 7, while a fixed offset voltage $V_{offset}$ can be applied to the selected dummy lines to obtain a lower second effective erase voltage $V_{eff\_SelDum}$, additional voltage regulators are needed to provide the fixed offset voltage $V_{offset}$, which can increase cost by increase the circuit area.

Alternatively (option 2), the selected dummy lines (e.g., first top dummy line 654 and first bottom dummy line 664 in FIG. 6) can be provided with a first voltage $V_1$ that is different from the second voltage $V_2$ provided to the unselected dummy lines. For example, the first voltage $V_1$ can be generated by applying a first hold voltage $V_{hld\_1}$ for a first time period $t_{hld\_1}$, where the first hold voltage $V_{hld\_1}$ can be lower or higher than the second hold voltage $V_{hld\_2}$, and the first time period $t_{hld\_1}$ can be longer or shorter than the second time period $t_{hld\_2}$. After the first time period $t_{hld\_1}$, the first hold voltage $V_{hld\_1}$ can be removed (or released) such that the selected dummy lines can be left floating. In FIG. 7, the first hold voltage $V_{hld\_1}$ can be applied to the selected dummy lines at the beginning of the erase stage. In one implementation, the first hold voltage $V_{hld\_1}$ can be the same as the source supply voltage $V_{ss}$. The selected dummy lines can be left floating after the first hold voltage $V_{hld\_1}$ (e.g., $V_{hld\_1}=V_{ss}$) is removed. Electric potentials (dashed lines) of the selected dummy lines can increase to the first voltage $V_1$ after certain time period due to capacitance couplings to the channel layer 338, bit lines 341 and/or the ACS 346 (see FIG. 6).

The first voltage $V_1$ can be increased by increasing the first hold voltage $V_{hld\_1}$ and/or reducing the first time period $t_{hld\_1}$. The first voltage $V_1$ can be decreased by decreasing the first hold voltage $V_{hld\_1}$ and/or increasing the first time period $t_{hld\_1}$. As such, the selected dummy lines can be effectively provided with the first voltage $V_1$ through capacitive coupling after the first time period $t_{hld\_1}$, where the first voltage $V_1$ corresponds to the electric potential of the selected dummy lines when floating.

The second set of memory cells coupled to the selected dummy lines can be erased both during the first time period this 1 and after the first time period $t_{hld\_1}$. During the erase stage, electric potential of the channel layers 338 (see FIG. 6) can be raised to a voltage close to the erase voltage $V_{erase}$ from electrical connections to the ACS (bottom) and/or bit lines (top). With a negative voltage difference between the selected dummy lines (e.g., the first top dummy line 654 and the first bottom dummy line 664) and the channel layers 338, electrical charges (e.g., electrons) stored in corresponding memory films 337 can be removed and the second set of memory cells coupled to the selected dummy lines can be reset to the erased state ER. After the first time period $t_{hld\_1}$, the second set of memory cells coupled to the selected dummy lines can be erased at the second effective erase voltage $V_{eff\_SelDum}$ with a magnitude about $|V_{erase}-V_1|$. By adjusting the first hold voltage $V_{hld\_1}$ and/or the first time period $t_{hld\_1}$, the first voltage $V_1$ can be adjusted and thereby the second effective erase voltage $V_{eff\_SelDum}$ can be adjusted without introducing extra power supply or voltage regulator. In addition, the second set of memory cells can be erased during the first time period $t_{hld\_1}$ by a voltage different of $|V_{erase}-V_{hld\_1}|$ that is across the second set of memory cells. By increasing the first hold voltage $V_{hld\_1}$ and/or reducing the first time period $t_{hld\_1}$, the charges removed due to the voltage different of $|V_{erase}-V_{hld\_1}|$ can also be reduced, and vice versa. The erasing operation of the second set of memory cells can thereby being adjusted for an additional reason. A suitable first time period $t_{hld\_1}$ can be selected to provide a suitable first voltage $V_1$ when the selected dummy lines are floating, while desirable erasing can also be performed during the first time period $t_{hld\_1}$ with the first hold voltage $V_{hld\_1}$. Accordingly, the second set of memory cells coupled to the second set of gate electrodes (e.g., the selected dummy lines) can be erased shallower than the first set of memory cells coupled to the first set of gate electrodes (e.g., the word lines) by adjusting the first hold voltage $V_{hld\_1}$ and/or the first time period $t_{hld\_1}$.

It is noted that FIG. 7 illustrates word lines and selected dummy lines as an example for the first set of gate electrodes and the second set of gate electrodes, respectively. It is noted that similar schemes can be applied to any other gate electrodes, where the second set of gate electrodes are coupled to the second set of memory cells which are programmed to a second storage mode different from a first storage mode, to which the first set of memory cells coupled to the first set of gate electrodes are programmed. Each of the second set of memory cells under the second storage mode can store a second number of bits data, and each of the first set of memory cells under the first storage mode can store a first number of bits data, where the second number of bits data is different from the first number of bits data. The first set of memory cells can be erased by applying the source supply voltage $V_{ss}$ at the first set of gate electrodes. The second set of memory cells can be erased by applying the first hold voltage $V_{hld\_1}$ to the second set of gate electrodes during the first time period $t_{hld\_1}$ and also by generating (or providing) the first voltage $V_1$ at the second set of gate electrodes after the first time period $t_{hld\_1}$. The first voltage $V_1$ can be generated by applying the first hold voltage $V_{hld\_1}$ for the first time period $t_{hld\_1}$, and by subsequently removing the first hold voltage $V_{hld\_1}$ after the first time period $t_{hld\_1}$ such that the second set of gate electrodes are left floating (without any voltage bias applied). The first voltage $V_1$ corresponds to the electric potential which the second set of gate electrodes rise to when floating. As such, the first set of memory cells can be erased at the first effective erase voltage with a magnitude of $|V_{erase}-V_{ss}|$ and the second set of memory cells can be erased by the voltage difference of of $|V_{erase}-V_{hld\_1}|$ during the first time period $t_{hld\_1}$ and can also be erased at the second effective erase voltage with a magnitude of $|V_{erase}-V_1|$ after the first time period $t_{hld\_1}$. By adjusting the first hold voltage $V_{hld\_1}$ and/or the first time period $t_{hld\_1}$, the first voltage $V_1$ provided to the second set of gate electrodes through capacitive coupling can be adjusted. Therefore, the second set of memory cells can be erased at the voltage difference of $|V_{erase}-V_{hld\_1}|$ for the first time period $t_{hld\_1}$, and for a remaining time period of the erase stage the second set of memory cells can be erased at the second effective erase voltage of $|V_{erase}-V_1|$ that is different from the first effective erase voltage of $|V_{erase}-V_{ss}|$. Accordingly, the second set of memory cells coupled to the second set of gate electrodes can be erased shallower or deeper than the first set of memory cells coupled to the first set of gate electrodes.

The descriptions below also use selected dummy lines as examples, where the scope of the disclose is not so limiting.

Figures 8A, 8B:
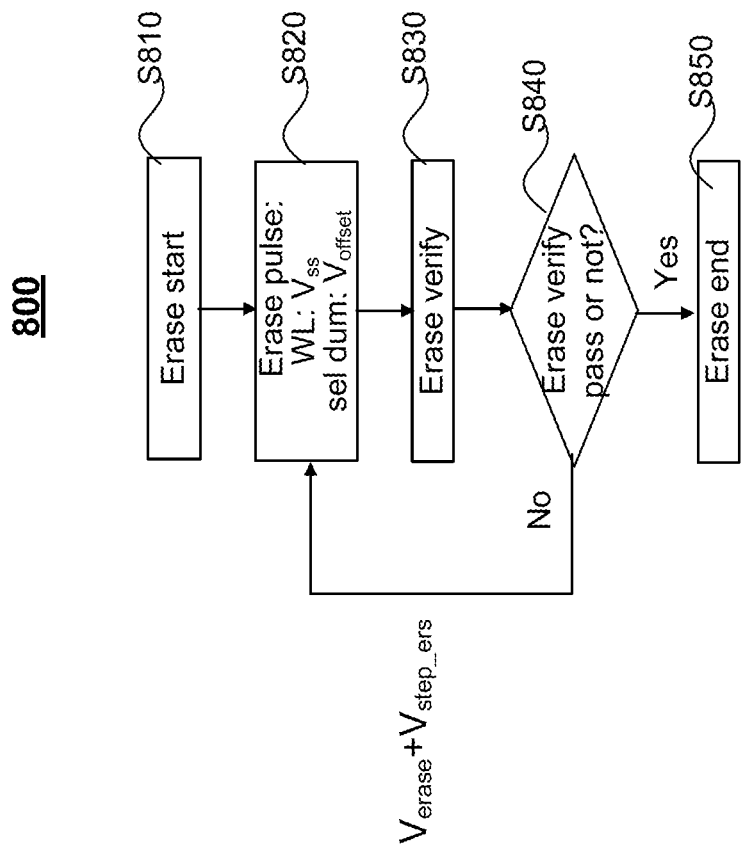
FIG. 8A illustrates a flow diagram of a method for an erase operation for a NAND memory device, according to some embodiments of the present disclosure.
FIG. 8B illustrates voltage pulses applied to selected dummy lines of a 3D NAND memory device, according to some embodiments of the present disclosure.

FIG. 8A illustrates a flow diagram of a method 800 for an erase operation for a NAND memory device, according to some embodiments of the present disclosure. It should be understood that the method 800 is not exhaustive and that other operation steps can be performed as well before, after, or between any of the illustrated operation steps. In some embodiments, some operation steps of method 800 can be omitted or other operation steps can be included, which are not described here for simplicity. In some embodiments, operation steps of method 800 can be performed in a different order and/or vary.

In the example below, method 800 can be implemented using waveforms shown in FIG. 7, with combination of the ISPE scheme shown in FIG. 5.

At operation step S810, the method 800 starts an erase operation for a memory block (e.g., the memory block 103 in FIG. 2). In some implementations, the memory cells of a same memory block share a common source line (e.g., ACS 346). At the prep stage of the erase operation, bit lines, ACS and all the gate electrodes of the memory block 103 can be applied with the source supply voltage $V_{ss}$ (see FIG. 7). In some embodiments, the first set of memory cells coupled to the word lines were previously programmed to the first storage mode (e.g., the QLC mode) and the second set of memory cells coupled to the selected dummy lines were previously programmed to the second storage mode (e.g., the SLC mode). In some embodiments, the first set of memory cells operate in the first storage mode can store more bits (i.e., data) than the second set of memory cells operate in the second storage mode.

At operation step S820, the erase voltage $V_{erase}$ can be applied to ACS 346 and/or bit line 341 of the memory block 103. In a first erase loop, the erase voltage $V_{erase}$ can be set at the initial erase voltage $V_{ers\_0}$. In the meantime, the source supply voltage $V_{ss}$ can be applied to the word lines 333 of the memory block 103, and the fixed offset voltage $V_{offset}$ can be applied to the selected dummy lines (e.g., first top dummy line 654 and first bottom dummy line 664 in FIG. 6) of the memory block 103. As such, the first set of memory cells coupled to the word lines 333 (the first set of gate electrodes) can be erased at the first effective erase voltage $V_{eff\_WL}$ with a magnitude about $|V_{erase}-V_{ss}|$ and the second set of memory cells coupled to the selected dummy lines (the second set of gate electrodes) can be erased at the second effective erase voltage $V_{eff\_SelDum}$ with a magnitude about $|V_{erase}-V_{offset}|$. When the fixed offset voltage $V_{offset}$ is higher than the source supply voltage $V_{ss}$, the second effective erase voltage $V_{eff\_SelDum}$ is less than the first effective erase voltage $V_{eff\_WL}$. The second set of memory cells coupled to the selected dummy lines can thereby be erased at a lower bias and be erased shallower than the first set of memory cells coupled to the word lines. Using similar scheme, in general, the memory cells operating in the second storage mode can be erased at a different effective bias (e.g., lower) than the memory cells operating in the first storage mode.

Also at the operation step S820, the TSGs (including the selected TSGs and unselected TSGs) and the unselected dummy lines (including the unselected top dummy lines and the unselected bottom dummy lines) can be provided with the second voltage $V_2$, where electric potentials of the TSGs and the unselected dummy lines can rise to the second voltage $V_2$ through capacitive coupling by applying the second hold voltage $V_{hld\_2}$ for the second time period $t_{hld\_2}$ and subsequently removing the second hold voltage $V_{hld\_2}$ to leave the TSGs and the unselected dummy lines floating. In one implementation, the second voltage $V_2$ can be about the erase voltage $V_{erase}$, resulting in small voltage differences between the TSGs and the channel layers of the memory cells, as well as between the unselected dummy lines and the channel layers of the memory cells. As such, the third set of memory cells coupled to the unselected dummy lines will not be erased.

At operation step S830, an erase verification operation can be performed to verify if the memory cells of the memory block 103 have been reset to the erased state ER. For example, the erase verification voltage EV can be applied to the word lines and selected dummy lines.

At operation step S840, it is determined whether the memory block 103 passes or fails the erase verification. For example, the threshold voltages of the memory cells in the memory block 103 can be compared with the erase verification voltage EV. If the threshold voltages of the memory cells are lower than the erase verification voltage EV, the memory cells pass the erase verification (see FIG. 4). Otherwise, the memory cells fail the erase verification. In one example, all memory cells of the memory block have to pass the erase verification. In another example, a predetermined number of memory cells of the memory block has to pass the erase verification.

If it is determined that the memory block 103 passes the erase verification, the method 800 proceeds to operation step S850 and ends the erase operation.

If it is determined that the memory block 103 fails the erase verification, the method 800 goes back to the operation step S820 to start another erase loop where the erase voltage $V_{erase}$ can be increased by the erase step voltage $V_{step\_ers}$. For a second erase loop, the erase voltage $V_{erase}$ can be expressed as a sum of the initial erase voltage $V_{ers\_0}$ and the erase step voltage $V_{step\_ers}$. For each subsequent erase loop, the erase voltage $V_{erase}$ can be incrementally increased by the erase step voltage $V_{step\_ers}$. Accordingly, the first effective erase voltage $V_{eff\_WL}$ with the magnitude about $|V_{erase}-V_{ss}|$ for erasing the memory cells coupled to the word lines also increases incrementally in each erase loop.

In the method 800, during the second and each of the subsequent erase loops, the selected dummy lines are also applied with the fixed offset voltage $V_{offset}$. Voltage pulses applied to the selected dummy lines are shown in FIG. 8B. The second set of memory cells coupled to the selected dummy lines can be erased at the second effective erase voltage $V_{eff\_SelDum}$ (about $|V_{erase}-V_{offset}|$), which also increases incrementally by the erase step voltage $V_{step\_ers}$ in each subsequent erase loop.

Figure 9B:
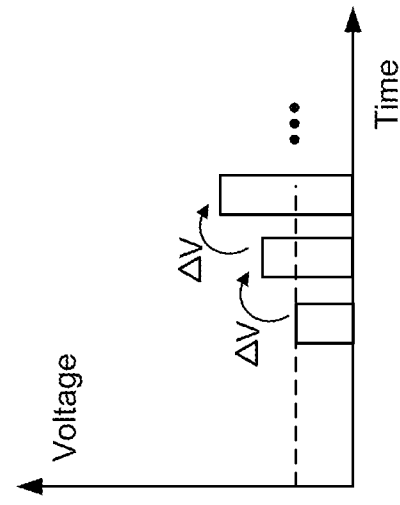
FIG. 9B illustrates voltage biases applied to memory cells coupled to selected dummy lines of a 3D NAND memory device during an erase operation, according to some embodiments of the present disclosure.
Figure 9A:
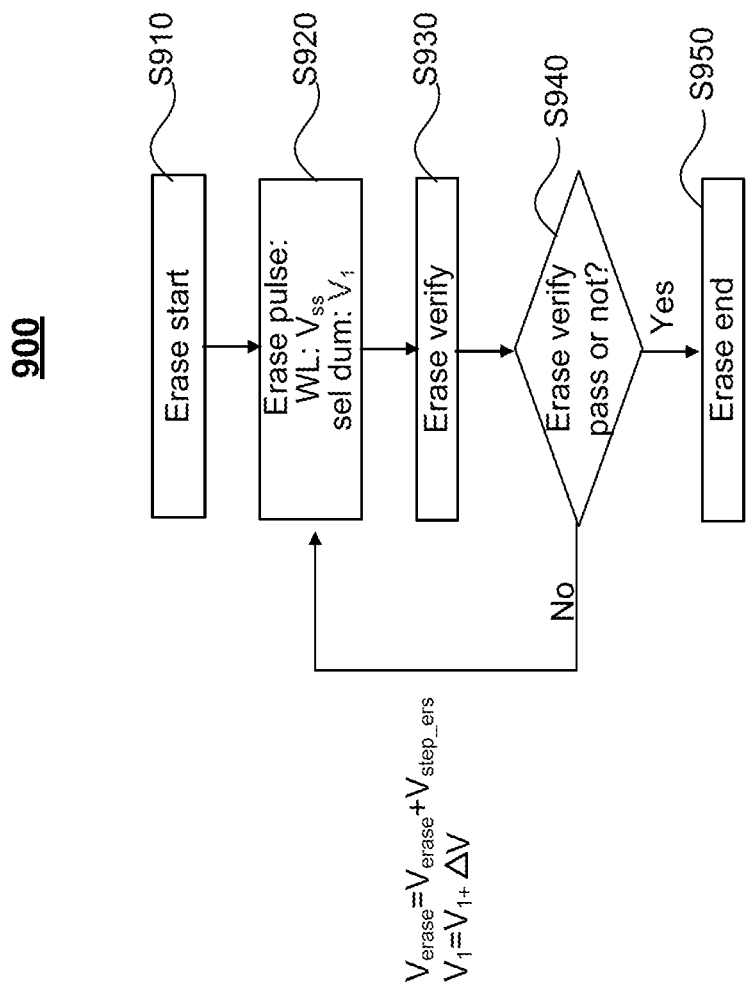
FIG. 9A illustrates a flow diagram of a method for an erase operation for a NAND memory device, according to some embodiments of the present disclosure.

FIG. 9A illustrates a flow diagram of a method 900 for an erase operation for a NAND memory device, according to some embodiments of the present disclosure. It should be understood that the method 900 is not exhaustive and that other operation steps can be performed as well before, after, or between any of the illustrated operation steps. In some embodiments, some operation steps of method 900 can be omitted or other operation steps can be included, which are not described here for simplicity. In some embodiments, operation steps of method 900 can be performed in a different order and/or vary.

Figure 10A:
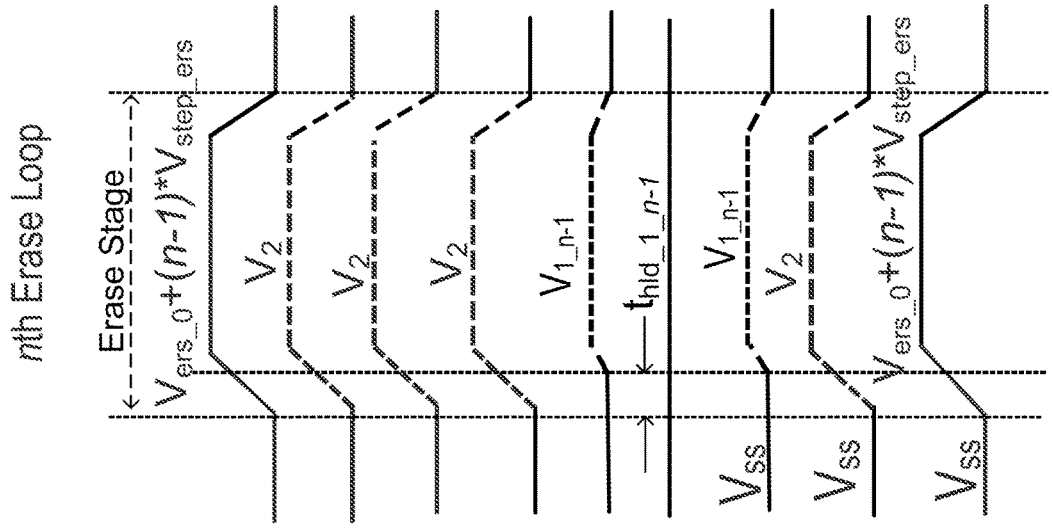
FIGS. 10A and 10B illustrate waveforms of gate electrodes for an erase operation for a 3D NAND memory device corresponding to FIGS. 9A-9B, according to some embodiments of the present disclosure.
Figure 10B:
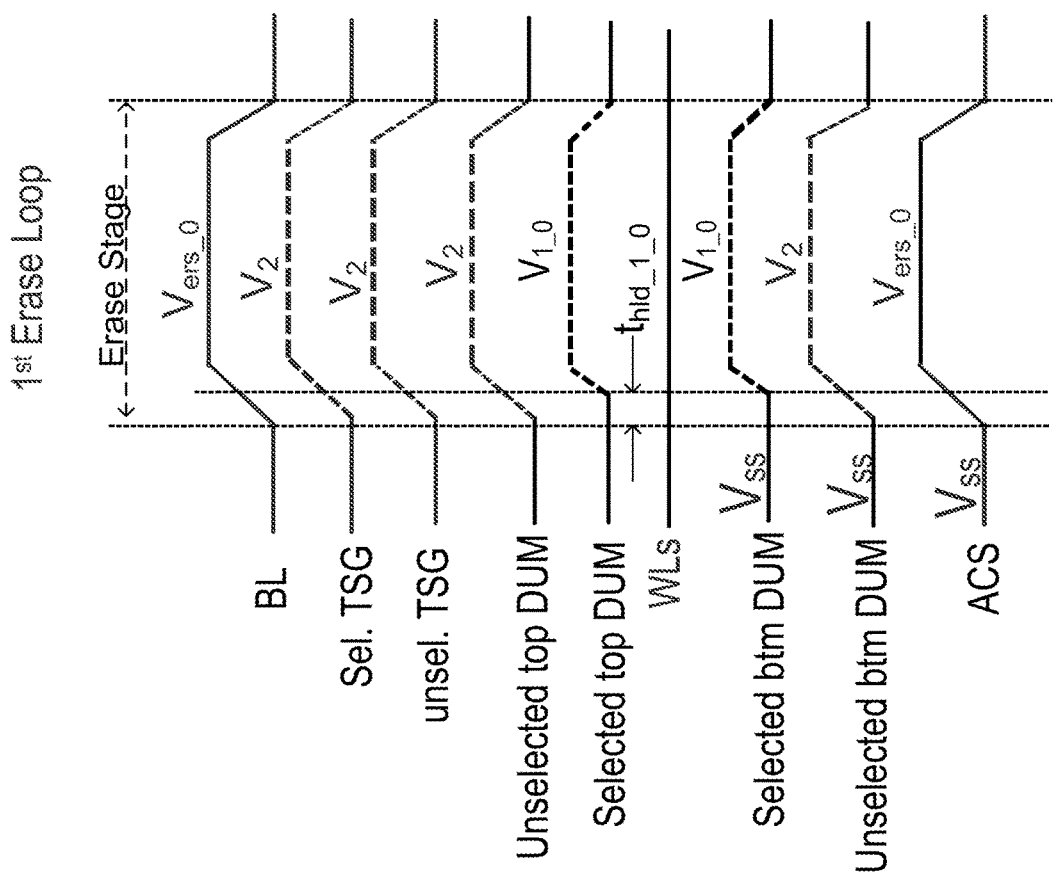

FIGS. 10A and 10B illustrate waveforms 1000A and 1000B of the gate electrodes for an erase operation during an initial erase loop and an nth erase loop, respectively, according to some embodiments of the present disclosure.

In the example below, method 900 can be implemented using waveforms 1000A and 1000B shown in FIGS. 10A and 10B, combined with the ISPE scheme shown in FIG. 5.

At operation step S910, the method 900 starts an erase operation for a memory block (e.g., the memory block 103 in FIG. 2). Similar to method 800, at the prep stage of the erase operation, bit lines, ACS and all the gate electrodes of the memory block 103 can be applied with the source supply voltage $V_{ss}$ (see FIG. 10A). In some embodiments, the first set of memory cells coupled to the word lines were previously programmed to the first storage mode (e.g., the QLC mode) and each of the first set of memory cells coupled to the word lines can store the first number of bits (e.g., 4 bits). The second set of memory cells coupled to the selected dummy lines were previously programmed to the second storage mode (e.g., the SLC mode) and each of the second set of memory cells coupled to the selected dummy lines can store the second number of bits (e.g., 1 bit), where the second number of bits is less than the first number of bits. Namely, the first set of memory cells operate in the first storage mode can store more bits (i.e., data) than the second set of memory cells operate in the second storage mode.

At operation step S920, the erase voltage $V_{erase}$ can be applied to ACS 346 and/or bit line 341 of the memory block 103. In a first erase loop, the erase voltage $V_{erase}$ can be set at the initial erase voltage $V_{ers\_0}$. In the meantime, the source supply voltage $V_{ss}$ can be applied to the word lines 333 of the memory block 103. The first set of memory cells coupled to the word lines 333 can be erased at the first effective erase voltage $V_{eff\_WL}$ with the magnitude about $|V_{erase}-V_{ss}|$. Like the operation step S820, at the operation step S920, the TSGs (including the selected TSGs and unselected TSGs) and the unselected dummy lines (including the unselected top dummy lines and the unselected bottom dummy lines) can rise to the electric potentials of the second voltage $V_2$ that is close to the erase voltage $V_{erase}$.

Unlike the operation step S820 in FIG. 8A, at the operation step S920, the first voltage $V_1$ can be generated at the selected dummy lines (e.g., first top dummy line 654 and first bottom dummy line 664 in FIG. 6) of the memory block 103 in FIG. 9A. The first voltage $V_1$ can be generated by applying the first hold voltage $V_{hld\_1}$ for the first time period $t_{hld\_1}$. After the first time period $t_{hld\_1}$, the first hold voltage $V_{hld\_1}$ is removed and the selected dummy lines can be left floating without applying any voltage bias. The electric potential of the selected dummy lines can rise to the first voltage $V_1$ through capacitive coupling and can be changed by adjusting the first hold voltage $V_{hld\_1}$ and/or the first time period $t_{hld\_1}$. For example, when increasing the first time period this 1, the first voltage $V_1$ of the selected dummy lines can be lowered due to delayed capacitance coupling effect.

By generating the first voltage $V_1$, the second effective erase voltage $V_{eff\_SelDum}$ with a magnitude of $|V_{erase}-V_1|$ can be generated across the channel layer and the selected dummy line. In some embodiments, the first hold voltage $V_{hld\_1}$ can be the same as the second hold voltage $V_{hld\_2}$ and the source supply voltage $V_{ss}$. In this example, the first time period $t_{hld\_1}$ can be longer than the second time period $t_{hld\_2}$, such that the first voltage $V_1$ can be lower than the second voltage $V_2$ and thereby the second effective erase voltage $V_{eff\_SelDum}=|V_{erase}-V_1|$ can be larger than the third effective erase voltage $V_{eff\_unSelDum}=|V_{erase}-V_2|$. The second set of memory cells coupled to the selected dummy lines can be erased by the second effective erase voltage $V_{eff\_SelDum}=|V_{erase}-V_1|$ after the first time period $t_{hld\_1}$. On the other hand, when the first voltage $V_1$ of the selected dummy lines is higher than the source supply voltage $V_{ss}$, the second effective erase voltage $V_{eff\_SelDum}=|V_{erase}-V_1|$ can be less than the first effective erase voltage $V_{eff\_WL}=|V_{erase}-V_{ss}|$. Therefore, the second set of memory cells coupled to the selected dummy lines can be erased shallower than the first set of memory cells coupled to the word lines after the first time period this 1. The second effective erase voltage $V_{eff\_SelDum}$ can be reduced when the first voltage $V_1$ of the selected dummy lines increases. Accordingly, by adjusting the first time period $t_{hld\_1}$, the first voltage $V_1$ and thereby the second effective erase voltage $V_{eff\_SelDum}$ for the second set of memory cells can be adjusted.

Additionally, the second set of memory cells coupled to the selected dummy lines can be erased during the first time period this 1 by a voltage different of $|V_{erase}-V_{hld\_1}|$. By adjusting the first time period $t_{hld\_1}$, charges (e.g., electrons stored in the memory films of the memory cells) removed due to the voltage different of $|V_{erase}-V_{hld\_1}|$ across the second set of memory cells can also be adjusted. Increasing the first time period $t_{hld\_1}$, more charges will be removed and thereby the second set of memory cells will be erased deeper, and vice versa. Therefore, the second set of memory cells can be erased properly by adjusting the first time period $t_{hld\_1}$ to generate a suitable first voltage $V_1$ when the selected dummy lines are floating as well as desirable erasing during the first time period $t_{hld\_1}$.

In the example in FIGS. 9A and 9B, during the initial erase loop, the first voltage $V_1$ can be set to an initial first voltage $V_{1\_0}$ by setting the first time period $t_{hld\_1}$ to an initial first time period $t_{hld\_1\_0}$ (see FIG. 10A). In some embodiments, the initial first time period $t_{hld\_1\_0}$ can be longer than the second time period $t_{hld\_2}$ of the second voltage $V_2$.

At operation step S930, similar to the operation step S830, an erase verification operation can be performed to verify if the memory cells (including the first set of memory cells and the second set of memory cells) of the memory block 103 have been reset to the erased state ER, where the erase verification voltage EV can be applied to the word lines and selected dummy lines.

At operation step S940, similar to the operation step S840, it is determined whether the memory block 103 passes or fails the erase verification. If it is determined that the memory block 103 passes the erase verification, the method 900 proceeds to operation step S950 and ends the erase operation.

If it is determined that the memory block 103 fails the erase verification, the method 900 goes back to the operation step S920 to start another erase loop. Similar to the method 800 in FIG. 8A, the erase voltage $V_{erase}$ can be incrementally increased by the erase step voltage $V_{step\_ers}$ in each of the subsequent erase loops. Accordingly, the first set of memory cells coupled to the word lines can be erased at the first effective erase voltage $V_{eff\_WL}=|V_{erase}-V_{ss}|$, also incrementally increased in the subsequent erase loops. Different from the method 800, during the subsequent erase loops, the first voltage $V_1$ generated at the selected dummy lines can also be changed. In some embodiments, the first voltage $V_1$ of the selected dummy lines can be decreased incrementally. For example, shown in FIG. 10B, during the nth erase loop, the first voltage $V_1$ generated at the selected dummy lines can be decreased to $V_{1\_n-1}$. In some embodiments, the first voltage $V_1$ can be adjusted by adjusting the first time period $t_{hld\_1}$. In this example, during the second erase loop, the first time period $t_{hld\_1}$ can be increased such that the first voltage $V_1$ can be decreased. Similarly, during the nth erase loop, the first time period $t_{hld\_1}$ can be increased to $t_{hld\_1\_n-1}$ such that the first voltage $V_1$ can be decreased to $V_{1\_n-1}$.

As such, by incrementally decreasing the first voltage $V_1$, the second set of memory cells coupled to the selected dummy lines can be erased at the second effective erase voltage $V_{eff\_SelDum}=|V_{erase}-V_1|=|V_{ers\_0}-V_{1\_0}|+\Delta V$, which can be incrementally increased at a step of $\Delta V$. FIG. 9B shows the incrementally increased second effective erase voltage $V_{eff\_SelDum}$ across the channel layer and the selected dummy line during each erase loop. That is, by adjusting the first voltage $V_1$ (e.g., through changing the first time period $t_{hld\_1}$), the second effective erase voltage $V_{eff\_SelDum}$ can be incrementally increased at a different rate from the first effective erase voltage $V_{eff\_WL}$. Accordingly, the second set of memory cells coupled to the selected dummy lines can thereby be erased properly as the first set of memory cells coupled to the word lines.

Additionally, by increasing the first time period $t_{hld\_1}$ incrementally in each erase loop, the second set of memory cells coupled to the selected dummy lines can be erased for a longer time period by the voltage difference $|V_{erase}-V_{hld\_1}|$. Accordingly, the second set of memory cells can be erased more efficiently during each erase loop.

It is noted that in the examples in FIGS. 10A and 10B, the first time period $t_{hld\_1}$ increases incrementally so as to decrease the first voltage $V_1$ incrementally. In some embodiments, the first time period $t_{hld\_1}$ can also decrease incrementally in each of the subsequent erase loops such that the first voltage $V_1$ can be increased incrementally. In this example, the second effective erase voltage $V_{eff\_SelDum}$ can be decreased incrementally by $\Delta V$, smaller than the erase step voltage $V_{step\_ers}$ for the first set of memory cells coupled to the word lines. Additionally, by decreasing the first time period $t_{hld\_1}$ incrementally in each erase loop, the second set of memory cells coupled to the selected dummy lines can be erased for a shorter time period by the voltage difference $|V_{erase}-V_{hld\_1}|$. Accordingly, the second set of memory cells can be erased shallower during each erase loop. In another implementation, during each erase loop, the first voltage $V_1$ and the first time period $t_{hld\_1}$ can be changed by any suitable amount, which is not limited to a constant step value. In some implementations, the relationship between the first voltage $V_1$ and the first time period $t_{hld\_1}$ can be linear or not linear, which are all included in the scope of the present disclosure. In some embodiments, the first voltage $V_1$ can also be adjusted by changing the first hold voltage $V_{hld\_1}$ applied to the selected dummy lines during the first time period $t_{hld\_1}$. For example, the first voltage $V_1$ can be increased by increasing the first hold voltage $V_{hld\_1}$ and vice versa.

Figure 11:
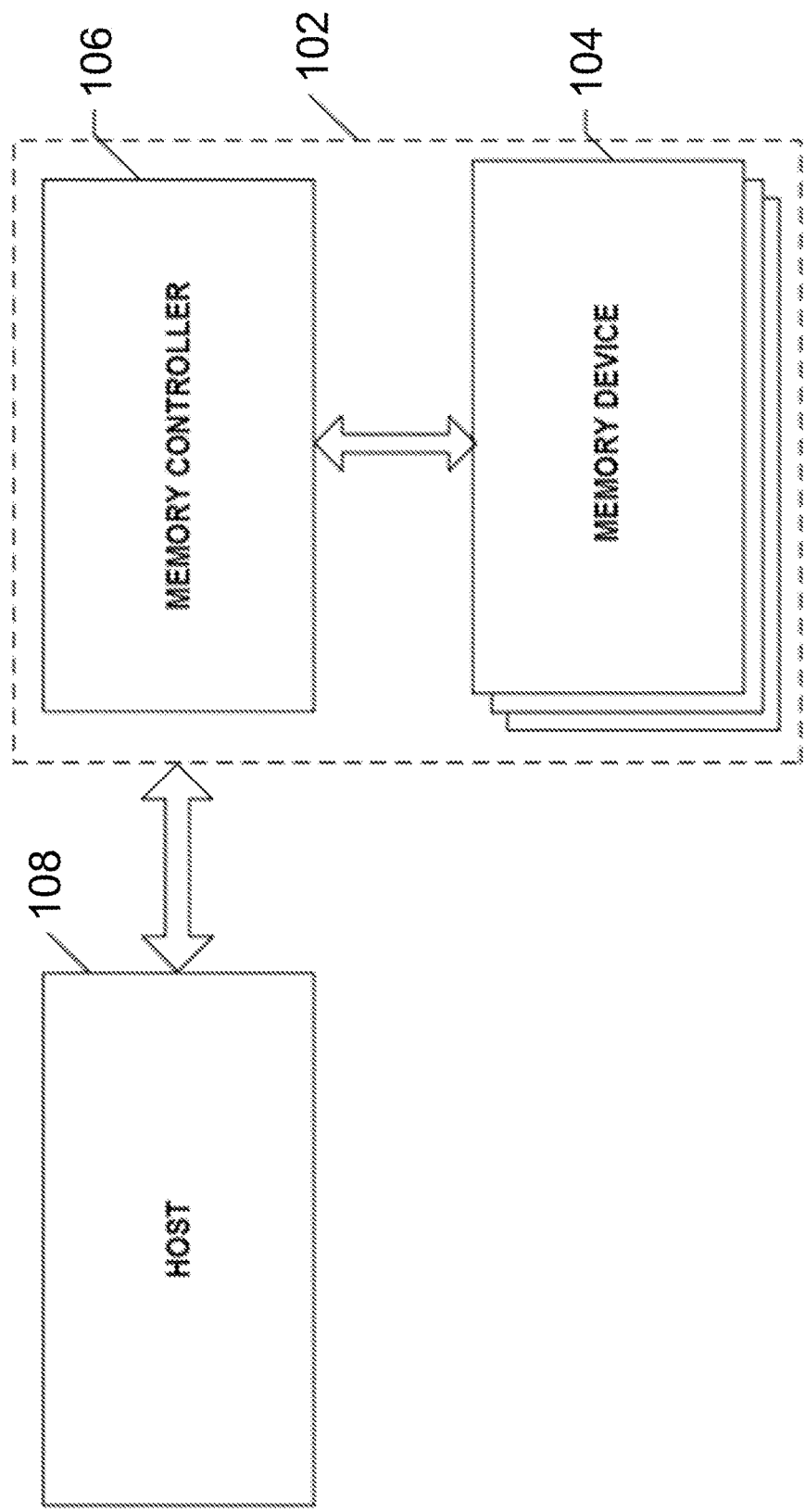
FIG. 11 illustrates a block diagram of an exemplary system having a memory device, according to some aspects of the present disclosure.

FIG. 11 illustrates a block diagram of an exemplary system 1100 having a memory device, according to some aspects of the present disclosure. System 1100 in FIG. 11 can be similar to the electronic apparatus S1 in FIG. 1A. The system 1100 can be a mobile phone, a desktop computer, a laptop computer, or any other suitable electronic devices having storage therein. As shown in FIG. 11, system 1100 can include a host 108 and a memory system 102 having one or more memory devices 104 and a memory controller 106. Host 108 can be configured to send or receive data to or from memory devices.

Memory device 104 can be any memory device disclosed in the present disclosure. Memory controller 106 is coupled to memory device 104 and host 108 and is configured to control memory device 104, according to some implementations. Memory controller 106 can manage the data stored in memory device 104 and communicate with host 108.

Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 106 and one or more memory devices 104 can be integrated into various types of storage devices, for example, being included in the same package, such as a universal Flash storage (UFS) package or an eMMC package. That is, memory system 102 can be implemented and packaged into different types of end electronic products.

Figure 12:
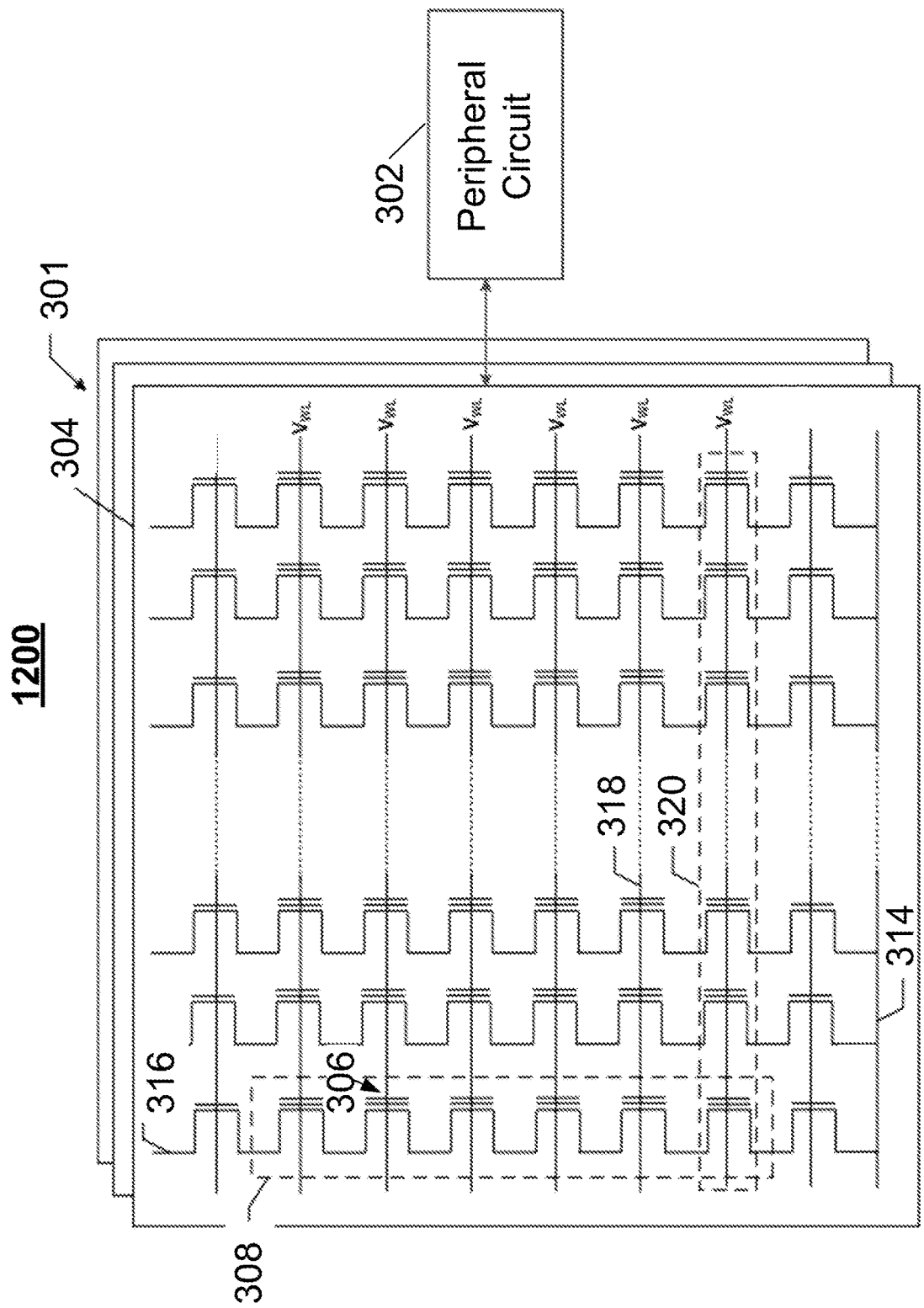
FIG. 12 illustrates a schematic circuit diagram of an exemplary memory device including peripheral circuits, according to some aspects of the present disclosure.

FIG. 12 illustrates a schematic circuit diagram of an exemplary memory device 1200 including peripheral circuits, according to some aspects of the present disclosure. Memory device 1200 can be an example of memory device 104 in FIG. 11. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate. In some implementations, each NAND memory string 308 includes a plurality of memory cells 306 coupled in series and stacked vertically.

As shown in FIG. 12, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a selected block 304, source lines 314 coupled to selected block 304 as well as unselected blocks 304 in the same plane as selected block 304 can be biased with an erase voltage (Vers), such as a high positive bias voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for read and program operations. The size of one page 320 in bits can relate to the number of NAND memory strings 308 coupled by word line 318 in one block 304.

As shown in FIG. 12, memory cell array 301 can include an array of memory cells 306 in a plurality of rows and a plurality of columns in each block 304. One row of memory cells 306 corresponds to one or more pages 320, and one column of memory cells corresponds to one NAND memory string 308, according to some implementations. The plurality of rows of memory cells 306 can be respectively coupled to word lines 318, and the plurality of columns of memory cells 306 can be respectively coupled to bit lines 316. Peripheral circuit 302 can be coupled to memory cell array 301 through bit lines 316 and word lines 318.

Figure 13:
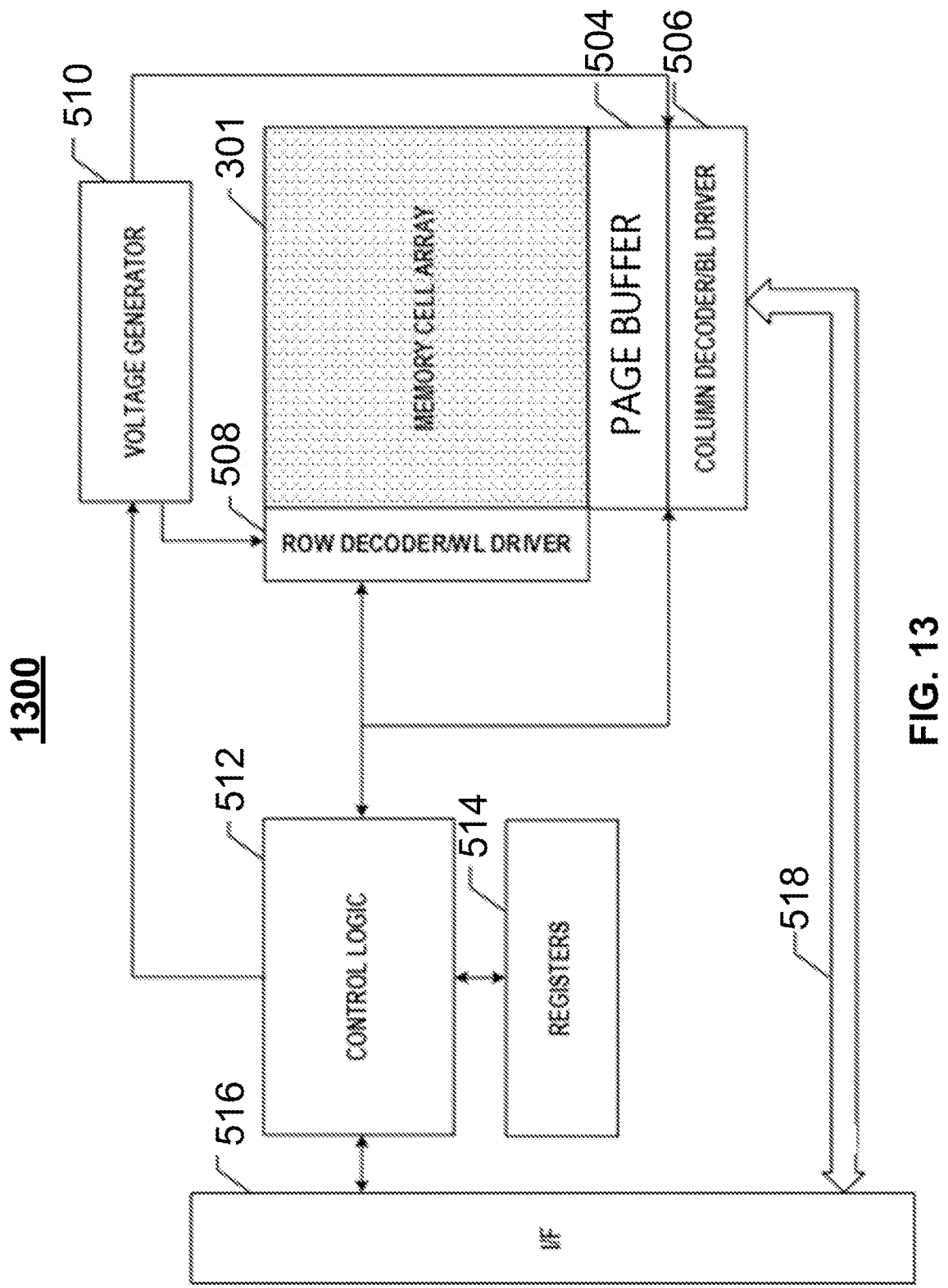
FIG. 13 illustrates some exemplary peripheral circuits, according to some aspects of the present disclosure.

FIG. 13 illustrates some exemplary peripheral circuits 1300 including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits that are not shown in FIG. 13 may be included as well.

Page buffer/sense amplifier 504 can be any page buffer disclosed in the present disclosure, and it can be configured to read and program (write) data from and to memory cell array 301 according to the control signals from control logic 512. In one example, page buffer/sense amplifier 504 may store one or more pages of program data (write data) to be programmed into a target row of memory cell array 301. In another example, page buffer/sense amplifier 504 may verify programmed target memory cells 306 in each program/verify loop (cycle) in a program operation to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation.

In program operations, page buffer/sense amplifier 504 can include storage modules (e.g., latches) for temporarily storing a piece of N-bits data (e.g., in the form of gray codes) received from data bus 518 and providing the piece of N-bits data to a corresponding target memory cell 306 through the corresponding bit line 316. In a read operation, page buffer/sense amplifier 504 can be configured to read one or more (M) bits of the piece of N-bits data.

Column decoder/bit line driver 506 can be configured to be controlled by control logic 512 and select one or more NAND memory strings 308 by applying bit line voltages generated from voltage generator 510. Row decoder/word line driver 508 can be configured to be controlled by control logic 512 and select/deselect blocks 304 of memory cell array 301 and select/deselect word lines 318 of block 304. Row decoder/word line driver 508 can be further configured to drive word lines 318 using word line voltages generated from voltage generator 510.

As part of peripheral circuits 302, control logic 512 can be coupled to other peripheral circuits described above and configured to control the operations of other peripheral circuits. Registers 514 can be coupled to control logic 512 and include status registers, command registers, and address registers for storing status information, command operation codes (OP codes), and command addresses for controlling the operations of each peripheral circuit. Interface (I/F) 516 can be coupled to control logic 512 and act as a control buffer to buffer and relay control commands received from a host to control logic 512 and status information received from control logic 512 to the host. Interface 516 can also be coupled to column decoder/bit line driver 506 via data bus 518 and act as a data input/output (I/O) interface and a data buffer to buffer and relay the data to and from memory cell array 301.

In summary, the present disclosure provides a method for erasing a memory device. The method includes applying an erase voltage to a common source line and/or a bit line of the memory device; and applying a word-line voltage to a word line of the memory device, wherein a first set of memory cells coupled to the word line are each configured to store a first number of bits data. The method also includes applying a hold voltage to a selected dummy line of the memory device for a first time period, wherein a second set of memory cells coupled to the selected dummy line are each configured to store a second number of bits data, and the second number is less than the first number. The method further includes removing the hold voltage from the selected dummy line after the first time period such that an electric potential of the selected dummy line rises to a first voltage, wherein the first voltage is higher than the word-line voltage. The method further includes increasing the first time period incrementally in each of subsequent erase loops.

The present disclosure also provides a memory device. The memory device includes an array of memory cells arranged in a plurality of rows; a plurality of word lines respectively coupled to the plurality of rows of the memory cells; and a peripheral circuit coupled to the plurality of word lines. The peripheral circuit is configured to apply an erase voltage to a common source line and/or bit lines of the memory device; and apply a word-line voltage to the plurality of word line, wherein a first set of memory cells coupled to the plurality of word lines are each configured to store a first number of bits data. The peripheral circuit is also configured to apply a hold voltage to a selected dummy line of the memory device for a first time period, wherein a second set of memory cells coupled to the selected dummy line are each configured to store a second number of bits data, and the second number is less than the first number. The peripheral circuit is further configured to remove the hold voltage from the selected dummy line after the first time period such that an electric potential of the selected dummy line rises to a first voltage, wherein the first voltage is higher than the word-line voltage. The peripheral circuit is also configured to increase the first time period incrementally in each of subsequent erase loops.

The present disclosure further provides a storage system. The storage system includes a memory controller configured to issue an erase command; and a memory device configured to perform erasing according to the erase command. The memory device includes an array of memory cells arranged in a plurality of rows; a plurality of word lines respectively coupled to the plurality of rows of the memory cells; and a peripheral circuit coupled to the plurality of word lines. The peripheral circuit is configured to apply an erase voltage to a common source line and/or bit lines of the memory device; and apply a word-line voltage to the plurality of word line, wherein a first set of memory cells coupled to the plurality of word lines are each configured to store a first number of bits data. The peripheral circuit is also configured to apply a hold voltage to a selected dummy line of the memory device for a first time period, wherein a second set of memory cells coupled to the selected dummy line are each configured to store a second number of bits data, and the second number is less than the first number. The peripheral circuit is further configured to remove the hold voltage from the selected dummy line after the first time period such that an electric potential of the selected dummy line rises to a first voltage, wherein the first voltage is higher than the word-line voltage. The peripheral circuit is also configured to increase the first time period incrementally in each of subsequent erase loops.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for erasing a memory device, comprising:
applying an erase voltage to a common source line and/or a bit line of the memory device;
applying a word-line voltage to a word line of the memory device, wherein a first set of memory cells coupled to the word line are each configured to store a first number of bits data;
applying a hold voltage to a selected dummy line of the memory device for a first time period, wherein a second set of memory cells coupled to the selected dummy line are each configured to store a second number of bits data, and the second number is less than the first number;
removing the hold voltage from the selected dummy line after the first time period such that an electric potential of the selected dummy line rises to a first voltage, wherein the first voltage is higher than the word-line voltage; and
increasing the first time period incrementally in each of subsequent erase loops.

2. The method of claim 1, wherein the first voltage decreases incrementally in each of the subsequent erase loops.

3. The method of claim 1, further comprising:
increasing the erase voltage incrementally in each of the subsequent erase loops.

4. The method of claim 3, further comprising:
increasing the erase voltage by an erase step voltage in each of the subsequent erase loop.

5. The method of claim 1, further comprising:
applying a further hold voltage to an unselected dummy line for a second time period; and
removing the further hold voltage from the unselected dummy line after the second time period such that a further electric potential of the unselected dummy line rises to a second voltage higher than the first voltage.

6. The method of claim 5, further comprising:
applying the further hold voltage to a top select gate for the second time period; and
removing the further hold voltage from the top select gate after the second time period such that a third electric potential of the top select gate rises to the second voltage.

7. The method of claim 5, wherein the second time period is shorter than the first time period.

8. The method of claim 5, wherein the further hold voltage and the hold voltage have same magnitudes.

9. The method of claim 1, further comprising:
performing a verify operation to determine whether the first set of memory cells and the second set of memory cells are at an erased state.

10. The method of claim 9, further comprising:
proceeding to a subsequent erase loop when the first set of memory cells and/or the second set of memory cells fail the verification.

11. A memory device, comprising:
an array of memory cells arranged in a plurality of rows;
a plurality of word lines respectively coupled to the plurality of rows of the memory cells; and
a peripheral circuit coupled to the plurality of word lines and configured to:
apply an erase voltage to a common source line and/or bit lines of the memory device;
apply a word-line voltage to the plurality of word line, wherein a first set of memory cells coupled to the plurality of word lines are each configured to store a first number of bits data;
apply a hold voltage to a selected dummy line of the memory device for a first time period, wherein a second set of memory cells coupled to the selected dummy line are each configured to store a second number of bits data, and the second number is less than the first number; and
remove the hold voltage from the selected dummy line after the first time period such that an electric potential of the selected dummy line rises to a first voltage, wherein the first voltage is higher than the word-line voltage; and
increase the first time period incrementally in each of subsequent erase loops.

12. The memory device of claim 11, wherein the first voltage decreases incrementally in each of the subsequent erase loops.

13. The memory device of claim 11, wherein the erase voltage is increased incrementally in each of the subsequent erase loops.

14. The memory device of claim 13, wherein the erase voltage is increased by an erase step voltage in each of the subsequent erase loop.

15. The memory device of claim 11, wherein the peripheral circuit is further configured to:
apply a further hold voltage to an unselected dummy line for a second time period; and
remove the further hold voltage from the unselected dummy line after the second time period such that a further electric potential of the unselected dummy line rises to a second voltage higher than the first voltage.

16. The memory device of claim 15, wherein the unselected dummy line comprises a top select gate.

17. The memory device of claim 15, wherein the second time period is shorter than the first time period.

18. The memory device of claim 11, wherein the peripheral circuit is further configured to:
perform a verify operation to determine whether the first set of memory cells and the second set of memory cells are at an erased state.

19. The memory device of claim 18, wherein the peripheral circuit is further configured to:
proceed to a subsequent erase loop when the first set of memory cells and/or the second set of memory cells fail the verification.

20. A storage system, comprising:
a memory controller configured to issue an erase command; and
a memory device configured to perform erasing according to the erase command, comprising:
an array of memory cells arranged in a plurality of rows;
a plurality of word lines respectively coupled to the plurality of rows of the memory cells; and
a peripheral circuit coupled to the plurality of word lines and configured to:
apply an erase voltage to a common source line and/or bit lines of the memory device;
apply a word-line voltage to the plurality of word line, wherein a first set of memory cells coupled to the plurality of word lines are each configured to store a first number of bits data;
apply a hold voltage to a selected dummy line of the memory device for a first time period, wherein a second set of memory cells coupled to the selected dummy line are each configured to store a second number of bits data, and the second number is less than the first number; and
remove the hold voltage from the selected dummy line after the first time period such that an electric potential of the selected dummy line rises to a first voltage, wherein the first voltage is higher than the word-line voltage; and
increase the first time period incrementally in each of subsequent erase loops.

* * * * *